United States Patent
Park et al.

(10) Patent No.: US 9,823,323 B2
(45) Date of Patent: Nov. 21, 2017

(54) METHOD AND APPARATUS FOR PROVIDING INFORMATION ABOUT PULSE SEQUENCE FOR MAGNETIC RESONANCE IMAGING

(71) Applicant: SAMSUNG ELECTRONICS CO., LTD., Suwon-si (KR)

(72) Inventors: Sung-Hun Park, Seoul (KR); Keum-yong Oh, Suwon-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 581 days.

(21) Appl. No.: 14/479,996

(22) Filed: Sep. 8, 2014

(65) Prior Publication Data

US 2015/0071517 A1    Mar. 12, 2015

(30) Foreign Application Priority Data

Sep. 9, 2013  (KR) ........................ 10-2013-0108061
Aug. 13, 2014  (KR) ........................ 10-2014-0105435

(51) Int. Cl.
*G01R 33/54*    (2006.01)
(52) U.S. Cl.
CPC ................................. *G01R 33/546* (2013.01)
(58) Field of Classification Search
CPC .................................................. G01R 33/546
See application file for complete search history.

(56) References Cited

U.S. PATENT DOCUMENTS

| | | | |
|---|---|---|---|
| 6,664,989 B1 | 12/2003 | Snyder et al. | |
| 6,801,037 B1 | 10/2004 | Zhang | |
| 7,081,750 B1* | 7/2006 | Zhang | G01R 33/54 324/309 |
| 9,348,007 B2 | 5/2016 | Son et al. | |
| 2006/0174568 A1* | 8/2006 | Kinoshita | G06F 3/04845 52/395 |
| 2007/0101295 A1 | 5/2007 | Ding et al. | |
| 2011/0092797 A1 | 4/2011 | Wang et al. | |
| 2013/0169674 A1 | 7/2013 | Kim | |

FOREIGN PATENT DOCUMENTS

| | | |
|---|---|---|
| JP | 8-152971 A | 6/1996 |
| JP | 2007117739 A | 5/2007 |
| KR | 1020130049461 A | 5/2013 |
| KR | 1020130080311 A | 7/2013 |

OTHER PUBLICATIONS

Communication dated Jun. 1, 2016, issued by the Korean Intellectual Property Office in counterpart Korean Application No. 10-2014-0105435.

* cited by examiner

*Primary Examiner* — Gregory H Curran
(74) *Attorney, Agent, or Firm* — Sughrue Mion, PLLC

(57) ABSTRACT

Disclosed are a method and apparatus for providing information about a point of interest (POI) with respect to at least one pulse sequence for magnetic resonance imaging (MRI). The method includes receiving information about a first POI and at least a second POI of the at least one pulse sequence, analyzing the at least one pulse sequence, displaying the at least one pulse sequence, based on the analysis, marking the first POI and the at least second POI on the displayed at least one pulse sequence, matching a pointer with a closest POI with respect to the first POI and the at least second POI when the pointer is located within a predetermined range from at least one of the marked POIs, and displaying information about the matched POI.

20 Claims, 24 Drawing Sheets

(a)

(b)

(c)

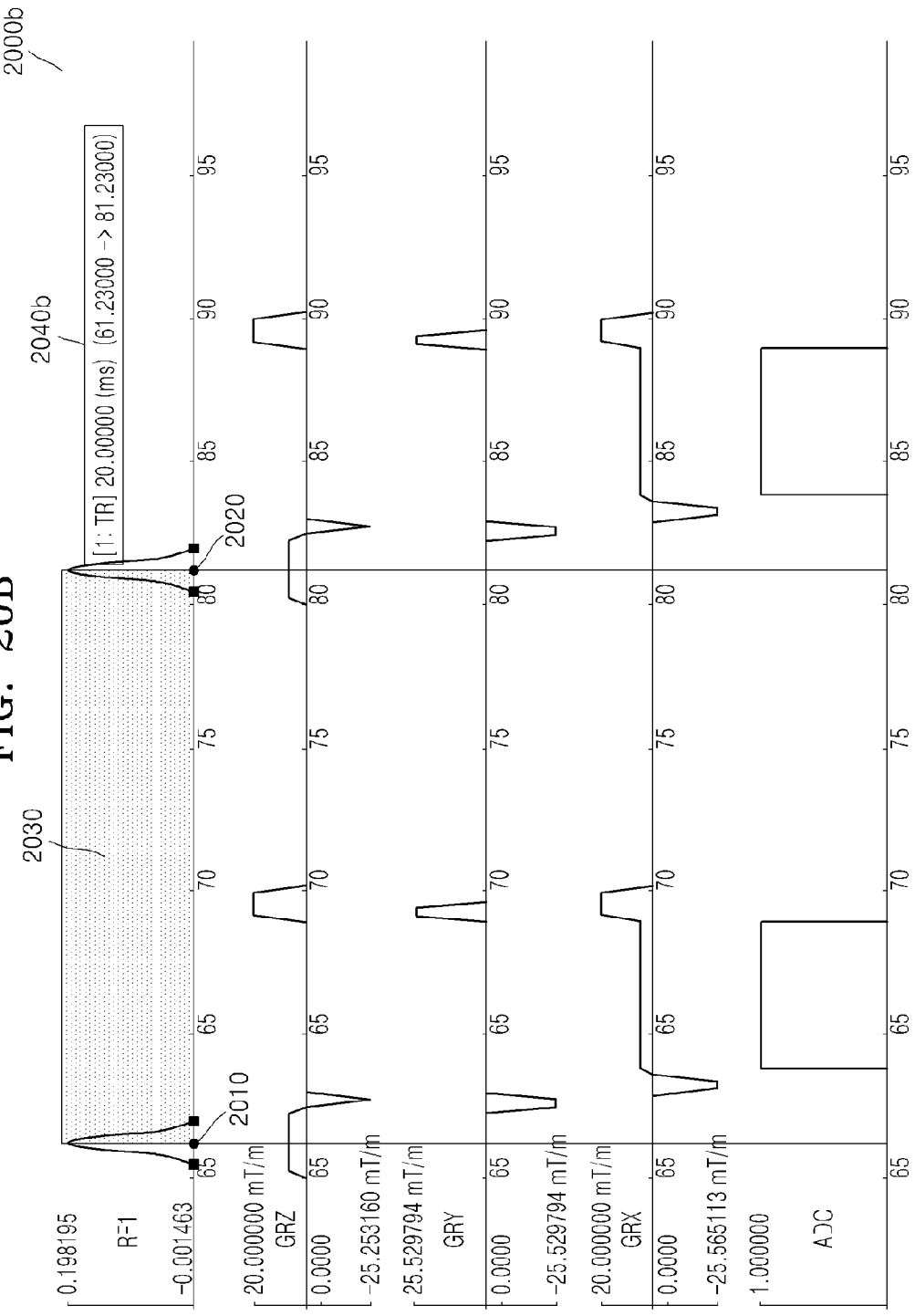

METHOD AND APPARATUS FOR PROVIDING INFORMATION ABOUT PULSE SEQUENCE FOR MAGNETIC RESONANCE IMAGING

CROSS-REFERENCE TO RELATED APPLICATIONS

This application claims priority from Korean Patent Application No. 10-2013-0108061, filed on Sep. 9, 2013, and Korean Patent Application No. 10-2014-0105435, filed on Aug. 13, 2014, in the Korean Intellectual Property Office, the disclosures of which are incorporated herein by reference in their respective entireties.

BACKGROUND

1. Field

One or more exemplary embodiments relate to a method and apparatus for providing information about a pulse sequence for magnetic resonance imaging, and more particularly, to a method and apparatus that more easily check information of a pulse sequence and edit the pulse sequence by using the checked information, in a pulse sequence designing operation.

2. Description of the Related Art

A magnetic resonance imaging (MRI) system is an apparatus for acquiring a sectional image of a part of an object by expressing, in a contrast comparison, strength of an MR signal with respect to a radio frequency (RF) signal generated in a magnetic field having a specific strength. For example, if an RF signal that resonates only a specific atomic nucleus (for example, a hydrogen atomic nucleus) is irradiated for an instant onto an object that is placed in a strong magnetic field and then such irradiation stops, an MR signal is emitted from the specific atomic nucleus, and thus an MRI system may receive the MR signal and acquire an MR image. The MR signal denotes an RF signal which is emitted from the object. An intensity of the MR signal may be determined based on a density of a predetermined atom (for example, hydrogen) of the object, a relaxation time T1, a relaxation time T2, and blood flow.

The MRI system has different characteristics from those of other imaging apparatuses. Unlike image apparatuses such as computed tomography (CT) apparatuses that acquire images based on a direction of detection hardware, MRI systems may acquire two-dimensional (2D) images or three-dimensional (3D) volume images that are oriented toward an optional point. MRI systems do not expose objects and examinees to radiation, unlike CT apparatuses, X-ray apparatuses, position emission tomography (PET) apparatuses, and single photon emission CT (SPECT) apparatuses; and MRI systems may acquire images having high soft tissue contrast, and may acquire neurological images, intravascular images, musculoskeletal images, and oncologic images that precisely show abnormal tissue.

An MRI system includes a magnet that generates a main magnetic field in a photographing space, an RF coil that transmits an RF signal to the photographing space, and a gradient coil that generates a gradient magnetic field for selecting a photographing region of an object in the photographing space. The MRI system applies a pulse sequence, for which a design has been performed for photographing the object, to the RF coil and the gradient magnetic field and acquires an echo signal generated from the RF signal which is received from the photographing space. In this case, a periodic pulse signal output from the RF coil and gradient magnetic coil is referred to as a pulse sequence.

The MRI system is noninvasive, has a better contrast of tissue than CT apparatuses, and has no artifacts caused by osseous tissue. In addition, the MRI system photographs various planes in a desired direction even without changing a position of an object, and thus is widely used along with other image diagnostic apparatuses.

SUMMARY

In order to obtain an MR image, an RF pulse sequence and a gradient pulse sequence may be applied to an object, and a response (echo) thereto may be received. In this case, a feature of the response may be vary based on the applied RF and gradient pulse sequences, and a feature and quality of the MR image are determined based on the response feature.

A diagnostic method based on an MR image has various advantages as described above. However, because a response feature varies based on a feature of a pulse sequence applied to an object, it is important to design a pulse sequence that is suitable for tissue of the object, a feature of a lesion, or a feature of an MR image which is to be acquired.

Additional aspects will be set forth in part in the description which follows and, in part, will be apparent from the description, or may be learned by practice of the presented exemplary embodiments.

According to one or more exemplary embodiments, a method for providing information about a point of interest (POI) of at least one pulse sequence for magnetic resonance imaging (MRI) includes: receiving information about at least one default POI of the at least one pulse sequence; analyzing the at least one pulse sequence; displaying the at least one pulse sequence, based on a result of the analyzing, and marking the at least one default POI on the displayed at least one pulse sequence; matching a pointer with a closest default POI from among the at least one default POI when the pointer is located within a predetermined range from the marked at least one default POI; and displaying information about the POI to which the pointer is matched.

The receiving may include receiving information about at least one additional POI of the at least one pulse sequence, the marking may include marking the at least one additional POI on the displayed at least one pulse sequence, and the matching may include matching the pointer with a closest POI from among the marked at least one default POI and the marked at least one additional POI when the pointer is located within the predetermined range from at least one of the marked at least one default POI and the marked at least one additional POI.

The method may further include matching the pointer with a next POI subsequent to the matching the pointer with the closest POI, wherein a determination of the next POI is based on an external input.

The method may further include storing the received information about the at least one default POI and storing the received information about the at least one additional POI.

The displaying the information about the POI to which the pointer is matched may include displaying the information by using at least one of a popup window and a tooltip box.

The method may further include displaying additional information associated with at least one of the at least one default POI and the at least one additional POI, based on the information about the POI to which the pointer is matched.

The at least one default POI may include at least one from among a piece of information about a start point, end point, and central point of at least one pulse sequence and a piece of information about a start point and end point of a plateau section.

The method may further include editing the at least one pulse sequence.

The editing may include correcting at least one from among the at least one default POI and the at least one additional POI.

The editing may include correcting at least one from among the information about the POI to which the pointer is matched and additional information associated with the at least one default POI and the at least one additional POI.

The matching may be activated or deactivated based on an external input.

The at least one pulse sequence may include a radio frequency (RF) pulse sequence, a gradient pulse sequence, and an analog-to-digital conversion (ADC) pulse sequence.

The method may further include: receiving an input which relates to setting an annotation of the POI to which the pointer is matched; and displaying the annotation of the POI to which the pointer is matched.

According to one or more exemplary embodiments, a method for providing information about a point of interest (POI) of a pulse sequence includes: receiving information about a plurality of POIs which includes at least one default POI or at least one additional POI, for at least one pulse sequence; analyzing the at least one pulse sequence; displaying a user interface screen which includes the at least one pulse sequence, based on a result of the analyzing, and marking the plurality of POIs on the displayed at least one pulse sequence; when a pointer is disposed within a predetermined range from at least one of the plurality of POIs, matching the pointer with a first POI which is a closest POI from among the plurality of POIs, in the user interface screen; selecting a second POI which is different from the first POI from among the plurality of POIs; and generating time difference information which relates to a difference between a time corresponding to the first POI and a time corresponding to the second POI, and displaying the generated time difference information on the user interface screen.

The selecting the second POI may include, when the pointer is dragged from the first POI and is disposed within the predetermined range from at least one of the plurality of POIs, matching the pointer with the second POI which is a closest POI thereto from among the plurality of POIs, in the user interface screen.

The method may further include: receiving a user input which relates to setting an annotation of the time difference information; and displaying the set annotation of the time difference information.

According to one or more exemplary embodiments, an MRI apparatus includes: a receiver configured to receive information about at least one default POI of the at least one pulse sequence; a pulse sequence analyzer configured to analyze the at least one pulse sequence; a display device configured to display the at least one pulse sequence, based on a result of the analyzing, and to mark the at least one default POI on the displayed at least one pulse sequence; and a snapping processor configured to match a pointer with a closest default POI from among a plurality of the at least one default POIs when the pointer is located within a predetermined range from the marked at least one default POI, and to control the display device to display information about the POI to which the pointer is matched.

The receiver may be further configured to receive information about at least one additional POI of the at least one pulse sequence, the display device may be further configured to mark the at least one additional POI on the displayed at least one pulse sequence, and the snapping processor may be configured to match the pointer with a closest POI from among the marked at least one default POI and the marked at least one additional POI when the pointer is located within the predetermined range from at least one of the marked at least one default POI and the marked at least one additional POI.

The snapping processor may be further configured to match the pointer with a next POI subsequent to matching the pointer with the closest POI, wherein a determination of the next POI is based on an external input.

The receiver may be further configured to store the received information about the at least one default POI and to store the received information about the at least one additional POI.

The snapping processor may be further configured to control the display device to display the information about the matched POI by using at least one of a popup window and a tooltip box.

The snapping processor may be further configured to control the display device to display additional information associated with at least one of the at least one default POI and the at least one additional POI, based on the information about the POI to which the pointer is matched.

The at least one default POI may include at least one from among a piece of information about a start point, end point, and central point of at least one pulse sequence and a piece of information about a start point and end point of a plateau section.

The receiver may be further configured to receive an input which relates to editing the at least one pulse sequence.

The MRI apparatus may further include a controller configured to edit at least one from among the at least one default POI and the at least one additional POI, based on the received input.

The MRI apparatus may further include a controller configured to edit at least one from among the information about the POI to which the pointer is matched and additional information associated with the at least one default POI and the at least one additional POI, based on the received input.

The snapping processor may be further configured to be activated or deactivated based on an external input.

The at least one pulse sequence may include a radio frequency (RF) pulse sequence, a gradient pulse sequence, and an analog-to-digital conversion (ADC) pulse sequence.

The receiver may be further configured to receive an input which relates to setting an annotation of the POI to which the pointer is matched, and the display device may be further configured display the annotation of the POI to which the pointer is matched.

According to one or more exemplary embodiments, an MRI apparatus includes: a receiver configured to receive information about a plurality of POIs which includes at least one default POI or at least one additional POI, for at least one pulse sequence; a pulse sequence analyzer configured to analyze at least one pulse sequence; a display device configured to display a user interface screen which includes the at least one pulse sequence, based on a result of the analyzing, and to mark the plurality of POIs on the displayed at least one pulse sequence; a snapping processor configured, when a pointer is disposed within a predetermined range from at least one of the plurality of POIs, to match the pointer with a first POI which is a closest POI from among the plurality of POIs, in the user interface screen, and to select a second POI which is different from the first POI from among the plurality of POIs; and a controller configured to generate time difference information which relates to a difference between a time corresponding to the first POI and a time corresponding to the second POI, and to control the display device to display the time difference information on the user interface screen.

When the pointer is dragged from the first POI and is disposed within the predetermined range from at least one of the plurality of POIs, the snapping processor may be further configured to select the second POI which is a POI which is closest to the pointer from among the plurality of POIs, in the user interface screen.

The receiver may be further configured to receive an input which relates to setting an annotation of the time difference information, and the display device may be further configured to display the set annotation of the time difference information.

According to one or more exemplary embodiments, provided is a non-transitory computer-readable storage medium storing a program for executing the method.

According to one or more exemplary embodiments, provided further is a non-transitory computer-readable storage medium storing a program for executing the method and another method and system for implementing one or more exemplary embodiments.

BRIEF DESCRIPTION OF THE DRAWINGS

These and/or other aspects will become apparent and more readily appreciated from the following description of exemplary embodiments, taken in conjunction with the accompanying drawings in which:

FIGS. 20A and 20B are examples of screens on which an annotation of time difference information between POIs of a pulse sequence for MRI is displayed, according to an exemplary embodiment.

DETAILED DESCRIPTION

Figure 1:
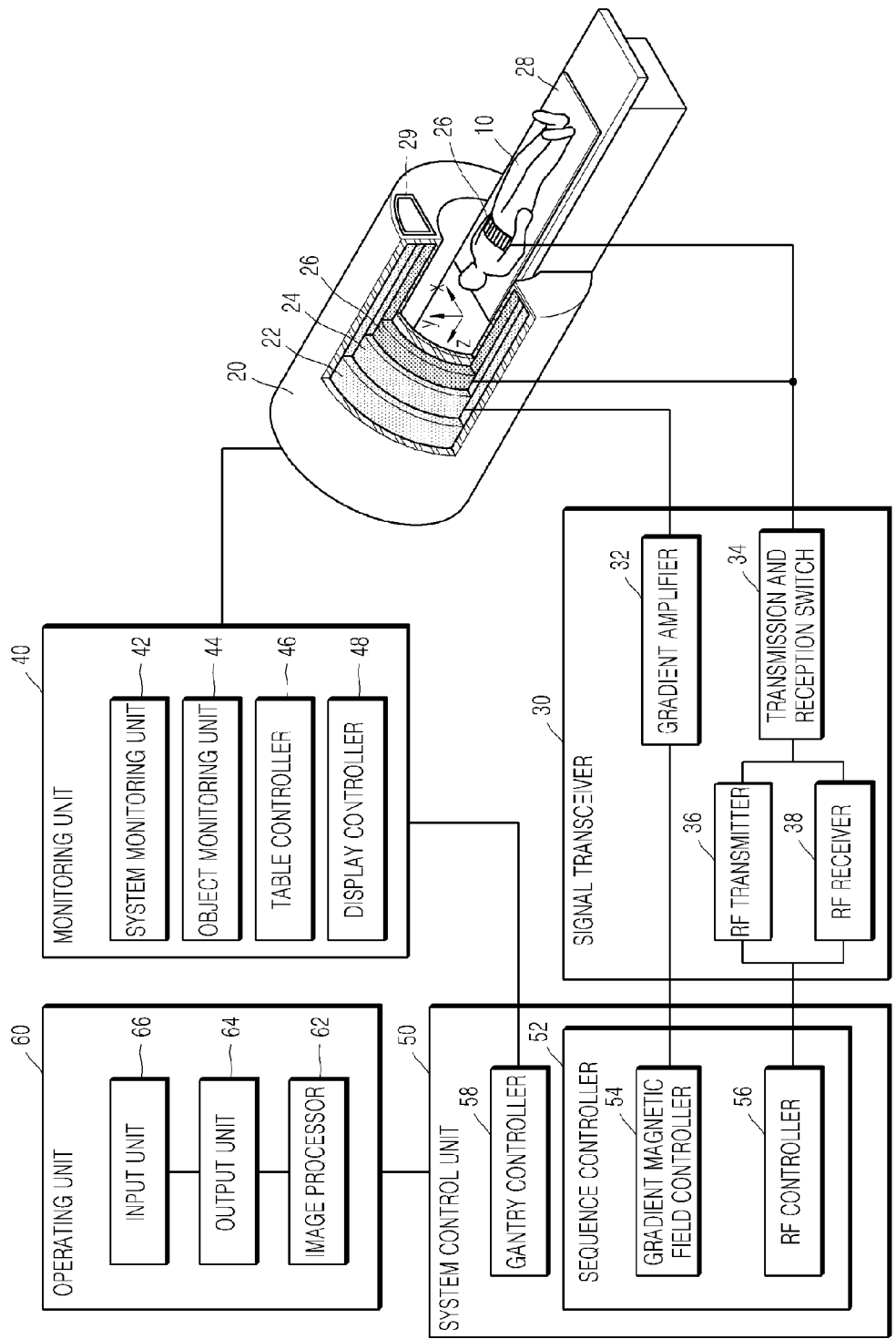
FIG. 1 is a schematic diagram of a general MRI system.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

One or more exemplary embodiments will now be described more fully with reference to the accompanying drawings. The present inventive concept may, however, be embodied in many different forms and should not be construed as being limited to the exemplary embodiments set forth herein; rather, these exemplary embodiments are provided so that this disclosure will be thorough and complete, and will fully convey the concept of the present disclosure to those skilled in the art.

Terms used herein will now be briefly described and then one or more exemplary embodiments will be described in detail.

General terms widely used are selected while considering functions in one or more exemplary embodiments for terms used herein, but the terms used herein may vary based on an intention of one of ordinary skill in the art, precedents, or emergence of new technologies. Also, in some cases, an applicant arbitrarily selects a term, and in this case, the meaning of the term will be described in detail herein. Accordingly, the terms shall be defined based on the meanings and details throughout the specification, rather than the simple names of the terms.

When something "includes" a component, another component may be further included unless specified otherwise.

The term "unit" used in the present specification refers to a software component, or a hardware component such as a field-programmable gate array (FPGA) or an application-specific integrated circuit (ASIC), and performs a certain function. However, the "unit" is not limited to software or hardware. The "unit" may be configured in an addressable storage medium and may be configured to be executed by one or more processors. Hence, the "unit" includes elements such as software elements, object-oriented software elements, class elements, and task elements, and processes, functions, attributes, procedures, sub-routines, segments of program codes, drivers, firmware, micro-codes, circuits, data, databases, data structures, tables, arrays, and variables. The functions provided in the elements and the units may be combined into a fewer number of elements and units or may be divided into a larger number of elements and units.

In the present specification, "image" may refer to multi-dimensional data composed of discrete image elements (e.g., pixels in a two-dimensional image and voxels in a three-dimensional image). For example, an image may include any one or more of a medical image of an object acquired by an X-ray, computed tomography (CT), magnetic resonance imaging (MRI), ultrasonic waves, and/or another medical image photographing apparatus.

Furthermore, in the present specification, "object" may include a person or an animal, and/or a part of a person or an animal. For example, the object may include the liver, the heart, the womb, the brain, a breast, the abdomen, or a blood vessel. Furthermore, the "object" may include a phantom. The phantom means a material having a volume that is approximately the intensity and effective atomic number of a living thing, and may include a sphere phantom having a property similar to a human body.

Furthermore, in the present specification, "user" may refer to a medical professional, such as a doctor, a nurse, a medical laboratory technologist, and an engineer who repairs a medical apparatus, but the user is not limited thereto.

Furthermore, in the present specification, "MRI" refers to an image of an object obtained by using the nuclear magnetic resonance principle.

Furthermore, in the present specification, "pulse sequence" refers to continuity of signals repeatedly applied by an MRI apparatus. A pulse sequence may include a time parameter of a radio frequency (RF) pulse, for example, repetition time (TR) or echo time (TE).

Furthermore, in the present specification, "pulse sequence mimetic diagram" shows an order of events that occur in an MRI apparatus. For example, a pulse sequence mimetic diagram may be a diagram showing an RF pulse, a gradient magnetic field, and/or an MR signal as a function of time.

While describing one or more exemplary embodiments, descriptions about drawings that are not related to the one or more exemplary embodiments are omitted.

FIG. 1 is a block diagram of a general MRI system. Referring to FIG. 1, the general MRI system may include a bore 20, a signal transceiver 30, a monitoring unit (also referred to herein as a "monitor") 40, a system control unit (also referred to herein as a "system controller") 50, and an operating unit (also referred to herein as an "operating device" and/or as an "operator") 60.

The bore 20 blocks electromagnetic waves generated by a main magnet 22, a gradient coil 24, and an RF coil 26 from being externally emitted. A magnetostatic field and a gradient magnetic field are formed in the bore 20, and an RF signal is irradiated towards an object 10.

The main magnet 22, the gradient coil 24, and the RF coil 26 may be arranged in a predetermined direction of the bore 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning a direction of magnetic dipole moments of atomic nuclei of the object 10 in a constant direction. A precise and accurate MR image of the object 10 may be obtained when a magnetic field generated by the main magnet 22 is strong and uniform.

The gradient coil 24 includes X, Y, and Z coils for generating gradient magnetic fields in X-axis, Y-axis, and Z-axis directions which are mutually orthogonal, i.e., directions which cross each other at right angles. The gradient coil 24 may provide location information of each region of the object 10 by variably inducing resonance frequencies based on the regions of the object 10.

The RF coil 26 may irradiate an RF signal to a patient and receive an MR signal which is emitted from the object 10. In detail, the RF coil 26 may transmit an RF signal at a same frequency as precessional motion to the patient towards atomic nuclei of precessional motion, stop transmitting the RF signal, and then receive an MR signal which is emitted from the object 10.

For example, in order to transition an atomic nucleus from a low energy state to a high energy state, the RF coil 26 may generate and apply an electromagnetic wave signal having an RF corresponding to a type of the atomic nucleus, for example, an RF signal, to the object 10. When the electromagnetic wave signal generated by the RF coil 26 is applied to the atomic nucleus, the atomic nucleus may transition from a low energy state to a high energy state. Then, when electromagnetic waves generated by the RF coil 26 disappear, the atomic nucleus, on which the electromagnetic waves have been applied, transitions from a high energy state to a low energy state, thereby emitting electromagnetic waves having a Larmor frequency. In this aspect, when the applying of the electromagnetic wave signal to the atomic nucleus is stopped, an energy level of the atomic nucleus is changed from a high energy level to a low energy level, and thus the atomic nucleus may emit electromagnetic waves having a Larmor frequency. The RF coil 26 may receive electromagnetic wave signals from atomic nuclei of the object 10.

The RF coil 26 may be realized as one RF transmitting and receiving coil having both a function of generating electromagnetic waves which have a wireless frequency corresponding to a type of an atomic nucleus and a function of receiving electromagnetic waves emitted from an atomic nucleus. Alternatively, the RF coil 26 may be realized as a transmission RF coil having a function of generating electromagnetic waves which have a wireless frequency corresponding to a type of an atomic nucleus and a reception RF coil having a function of receiving electromagnetic waves emitted from an atomic nucleus.

The RF coil 26 may be fixed to the bore 20 or may be detachable. When the RF coil 26 is detachable, the RF coil 26 may include an RF coil for a part of the object, such as any one or more of a head RF coil, a chest RF coil, a leg RF coil, a neck RF coil, a shoulder RF coil, a wrist RF coil, and/or an ankle RF coil.

The bore 20 may further include a display 29 which is disposed outside the bore 20 and a display (not shown) which is disposed inside the bore 20. The bore 20 may provide predetermined information to the user or to the object via the display 29 and the displays which are respectively disposed outside and inside the bore 20.

The signal transceiver 30 may control the gradient magnetic field formed inside the bore 20 based on a predetermined MR sequence, and may control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 in the bore 20 and may supply a pulse signal for generating a gradient magnetic field with respect to the gradient coil 24 based on to control of a gradient magnetic field controller 54. By controlling the pulse signal supplied from the gradient amplifier 32 to the gradient coil 24, gradient magnetic fields in X-axis, Y-axis, and Z-axis directions may be composed.

The RF transmitter 36 and the RF receiver 38 may drive the RF coil 26. The RF transmitter 36 may supply an RF pulse at a Larmor frequency to the RF coil 26, and the RF receiver 38 may receive an MR signal received by the RF coil 26.

The transmission and reception switch 34 may adjust transmitting and receiving directions of the RF signal and the MR signal. For example, the RF signal may be irradiated to the object 10 via the RF coil 26 during a transmission mode, and the MR signal may be received by the object 10 via the RF coil 26 during a reception mode. The transmission and reception switch 34 may be controlled by a control signal from an RF controller 56.

The monitoring unit 40 may monitor and/or control the bore 20 and/or devices mounted on the bore 20. The monitoring unit 40 may include a system monitoring unit (also referred to herein as a "system monitor") 42, an object monitoring unit (also referred to herein as an "object monitor") 44, a table controller 46, and a display controller 48.

The system monitoring unit 42 may monitor any one or more of radiation dosage measurements in millisieverts (MSV), highly enriched uranium (HEU), power, and current (amperage, or Amp).

The object monitoring unit 44 monitors a state of the object 10. In detail, the object monitoring unit 44 may include any one or more of a camera (not shown) for observing a movement and/or a position of the object 10, a respiration measurer for measuring the respiration of the object 10, an electrocardiogram (ECG) measurer for measuring ECG of the object 10, and/or a temperature measurer for measuring a temperature of the object 10.

The table controller 46 controls a movement of the table 28 where the object 10 is positioned. The table controller 46 may control the movement of the table 28 based on a sequence control of a sequence controller 52. For example, during a movement of the object 10, the table controller 46 may continuously or discontinuously move the table 28 based on the sequence control of the sequence controller 52, and thus the object 10 may be photographed in a field of view (FOV) that is larger than that of the bore 20.

The display controller 48 controls the display 29 and the displays which are respectively positioned outside and inside the bore 20. In detail, the display controller 48 may turn on or off the display 29 and the displays outside and inside the bore 20, and may control a screen output of the display 29 and the displays. Also, when a speaker is located inside or outside the bore 20, the display controller 48 may turn on or off the speaker and/or control the speaker to output sound.

The system control unit 50 may include the sequence controller 52 for controlling a sequence of signals formed by the bore 20, and a bore controller (also referred to herein as a "gantry controller") 58 for controlling the bore 20 and devices mounted on the bore 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 based on a pulse sequence received from the operating unit 60. Here, the pulse sequence includes all information required to control the gradient amplifier 32, the RF transmitter 36, the RF receiver 38, and the transmission and reception switch 34, and, for example, may include information about any one or more of strength, an application time, and an application timing of a pulse signal applied to the gradient coil 24.

The operating unit 60 requests the system control unit 50 to transmit pulse sequence information while controlling an overall operation of the general MRI system.

The operating unit 60 may include an image processor 62 for processing an MR signal received from the RF receiver 38, an output unit (also referred to herein as an "output device") 64, and an input unit (also referred to herein as an "input device") 66.

The image processor 62 processes an MR signal received from the RF receiver 38 so as to generate MR image data of the object 10.

The image processor 62 performs any one of various signal processes, such as amplification, frequency transformation, phase detection, low frequency amplification, and filtering, on an MR signal received by the RF receiver 38, and performs A/D conversion to generate digital data of an MR signal. The image processor 62 may arrange digital data in a k space (for example, also referred to as a Fourier space or frequency space) of a memory and rearrange the digital data into image data via a 2D or 3D Fourier transformation.

The image processor 62 may perform a composition process or difference calculation process on image data if required. The composition process may include an addition process performed on a pixel or a maximum intensity projection (MIP) process. The image processor 62 may store not only rearranged image data, but also image data on which a composition process or difference calculation process is performed, in a memory (not shown) or in an external server.

The output unit 64 may output image data generated and/or rearranged by the image processor 62 to the user. Further, the output unit 64 may output information which is required for the user to manipulate the general MRI system, such as a user interface (UI), user information, and/or object information. The output unit 64 may include any one or more of a speaker, a printer, a liquid crystal display (LCD), a 3-dimensional (3D) display, and/or a transparent display, and/or any one of various output devices that are well known to those of ordinary skill in the art.

The user may input any one or more of object information, parameter information, a scan condition, a pulse sequence, and/or information about image composition or difference calculation by using the input unit 66. The input unit 66 may include any one or more of a keyboard, a mouse, a track ball, a voice recognizer, a gesture recognizer, and/or a touch screen, and/or may include any one of other various input devices that are well known to those of ordinary skill in the art.

The signal transceiver 30, the monitoring unit 40, the system control unit 50, and the operating unit 60 are separate components in FIG. 1, but it will be apparent to those of ordinary skill in the art that functions of the signal transceiver 30, the monitoring unit 40, the system control unit 50, and the operating unit 60 may be performed by another component. For example, the image processor 62 converts an MR signal received by the RF receiver 38 into a digital signal, but such a conversion to a digital signal may be directly performed by the RF receiver 38 or the RF coil 26.

The bore 20, the RF coil 26, the signal transceiver 30, the monitoring unit 40, the system control unit 50, and the operating unit 60 may be connected to each other via wires or wirelessly, and when they are connected wirelessly, the general MRI system may further include an apparatus (not shown) for synchronizing clocks therebetween. Communication between the bore 20, the RF coil 26, the signal transceiver 30, the monitoring unit 40, the system control unit 50, and the operating unit 60 may be performed by using a high-speed digital interface, such as low voltage differential signaling (LVDS), asynchronous serial communication, such as a universal asynchronous receiver transmitter (UART), a low-delay network protocol, such as an error synchronous serial communication or controller area network (CAN), and/or optical communication, and/or any other communication method that is well known to those of ordinary skill in the art.

Figure 2:
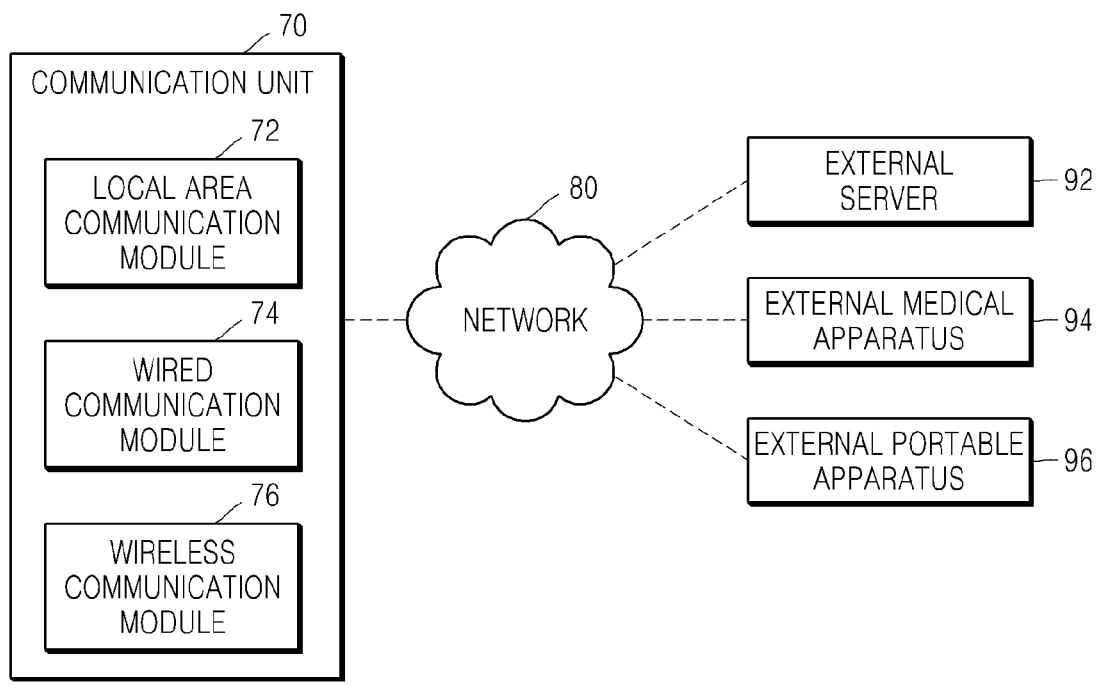
FIG. 2 is a diagram illustrating a configuration of a communication unit.

FIG. 2 is a diagram illustrating a configuration of a communication unit (also referred to herein as a "communication apparatus" and/or as a "communicator") 70.

The communication unit 70 may be connected to at least one of the bore 20, the signal transceiver 30, the monitoring unit 40, the system control unit 50, and the operating unit 60 of FIG. 1.

The communication unit 70 may transmit and/or receive data to or from a hospital server or another medical apparatus in a hospital that is connected via a picture archiving and communication system (PACS), and perform data communication according to the digital imaging and communications in medicine (DICOM) standard.

As shown in FIG. 2, the communication unit 70 may be connected to a network 80 via wires or wirelessly in order to communicate with an external server 92, an external medical apparatus 94, and/or an external portable apparatus 96.

In detail, the communication unit 70 may transmit and/or receive data related to the diagnosis of an object via the network 80, and may also transmit and/or receive a medical image captured by the external medical apparatus 94, such as a CT, an MRI, or an X-ray apparatus. In addition, the communication unit 70 may receive a diagnosis history and/or a treatment schedule of the object from the external server 92 in order to facilitate a diagnosis with respect to the object. The communication unit 70 may perform data communication not only with the external server 92 or the external medical apparatus 94 in a hospital, but also with the external portable apparatus 96, such as a mobile phone, a personal digital assistant (PDA), and/or a laptop of a doctor or customer.

The communication unit 70 may include at least one component which facilitates communication with an external apparatus, for example, a local area communication module 72, a wired communication module 74, and a wireless communication module 76.

The local area communication module 72 is a module configured for performing local area communication with a device within a predetermined distance. Examples of a local area communication technology include a wireless local area network (LAN), Wi-Fi, Bluetooth, ZigBee, Wi-Fi direct (WFD), ultra wideband (UWB), infrared data association (IrDA), Bluetooth low energy (BLE), and near field communication (NFC), but are not limited thereto.

The wired communication module 74 is a module configured for performing communication by using an electric signal and/or an optical signal. Examples of a wired communication technology include wired communication technologies using a pair cable, a coaxial cable, and an optical fiber cable, and other well-known wired communication technologies.

The wireless communication module 76 transmits and/or receives a wireless signal to or from at least one of a base station, an external apparatus, and a server in a mobile communication network. Here, the wireless signal may include data in any one of various formats which relate to transmitting and receiving a voice call signal, a video call signal, and a text/multimedia message.

Figure 3:
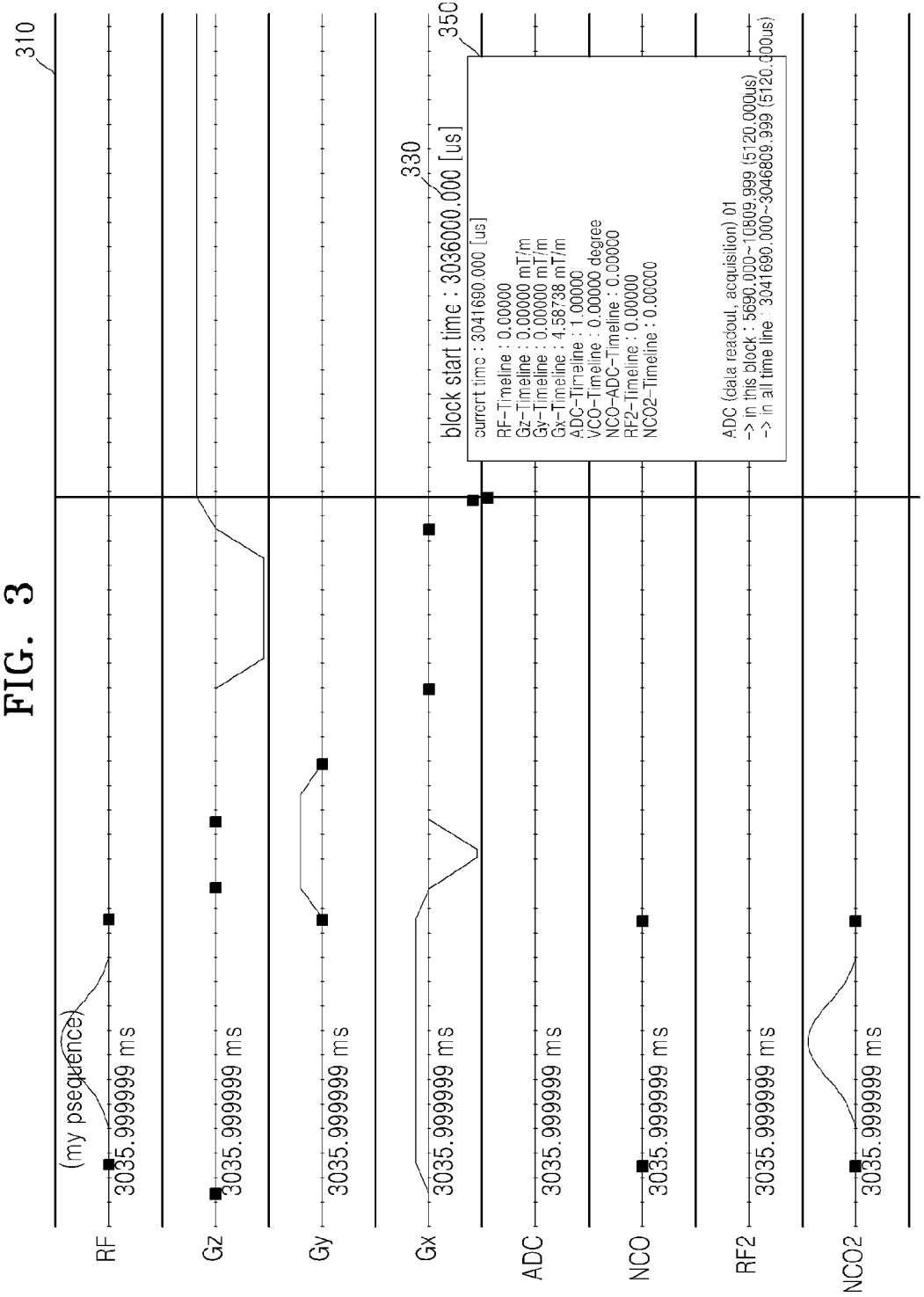
FIG. 3 is an example of a screen on which waveforms of signals and a pulse sequence used in an MRI system are displayed.

FIG. 3 is an example of a screen on which waveforms of signals and a pulse sequence used in an MRI system are displayed.

As described above, the MRI system acquires a sectional image of a part of an object by expressing, in a contrast comparison, a strength of an MR signal with respect to an RF signal generated in a magnetic field having a specific strength.

For example, if an RF signal that resonates only a specific atomic nucleus (for example, a hydrogen atomic nucleus) is irradiated for an instant onto an object that is placed in a strong magnetic field and then such irradiation stops, an MR signal is emitted from the specific atomic nucleus, and thus the MRI system may receive the MR signal and acquire an MR image. The MR signal corresponds to an RF signal emitted from the object. An intensity of the MR signal may be determined based on any one or more of a density of a predetermined atom (for example, hydrogen) of the object, a relaxation time T1, a relaxation time T2, and blood flow.

Because an RF signal and a gradient magnetic signal, which are applied to an object, have a pulse type, the RF signal is referred to as an RF pulse, and the gradient magnetic signal is referred to as a gradient pulse. Further, because the RF signal and the gradient magnetic signal are repeated at a period of a repetition time TR, an RF signal of one period or more is referred to as an RF pulse sequence, and a gradient magnetic signal of one period or more is referred to as a gradient pulse sequence.

A feature of an MR signal is determined based on features of an RF pulse sequence and a gradient pulse sequence which are applied to an object. Parameters for determining a feature of each pulse sequence mainly have a correlation therebetween. For example, a long repetition time TR decreases a T1 (i.e., a longitudinal relaxation time) effect and a short echo time TE decreases a T2 (i.e., a transverse relaxation time) effect. T1 and T2 are values that are determined based on an intrinsic characteristic of a material, and although the values are fixed depending on tissue, the repetition and echo times TR and TE are values that are adjustable by a pulse sequence designer. Therefore, a T1 weighted image and/or a T2 weighted image, which is applied to clinical medicine, may be acquired by appropriately adjusting the repetition and echo times TR and TE.

Moreover, the type of an echo is variable with respect to a feature of an applied RF pulse. In a spin echo technique that is a representative pulse sequence generation technique, atomic nuclei start to be dephased as soon as a 90-degree RF pulse is applied and then stopped, at which time a free induction decaying (FID) signal is emitted, and then various echo signals are obtained by using an RF coil in conjunction with a method for applying a 180-degree RF pulse.

In a fast spin echo (FSE) technique, a 90-degree RF pulse is applied to obtain a plurality of echoes, and after an FID signal is received, a 180-degree RF pulse is applied a plurality of times. In this case, a phase encoding gradient magnetic field is variably applied each time before each echo is obtained, and when an echo is obtained, by applying the phase encoding gradient magnetic field to an opposite side, several pieces of frequency-converted data are obtained within one repetition time. The FSE technique performs a scan for a shorter time than the SE technique.

In addition to SE and FSE, there are also other pulse sequence generation techniques, such as, for example, inversion recovery (IR), gradient echo (GE), field echo (FE), echo planar imaging (EPI), etc.

As described above, because a feature of an MR signal is determined based on features of an RF pulse sequence and a gradient pulse sequence which are applied to an object, designing a pulse sequence, which is to be applied to the object, is the most fundamental and important step for capturing an MR image, and it is important to design an appropriate pulse sequence for acquiring an MR image having a desired feature.

In the present specification, for convenience of description, a main agent (i.e., a user) that designs a pulse sequence for MRI is assumed to be an MRI system developer, but the present exemplary embodiment is not limited thereto. For example, examples of the main agent may include a doctor, a radiological technician, and a medical researcher.

In order to design a pulse sequence, an operation of generating a text-based source code is first performed, and a pulse sequence is simulated based on the generated source code. Although it may vary based on a development tool, the simulated pulse sequence is displayed by a monitor in a waveform with respect to time.

Item 310 of FIG. 3 illustrates an example of a screen on which waveforms of a simulated pulse sequence and signals are displayed.

In the waveforms of FIG. 3, RF denotes an RF pulse sequence, Gz denotes a gradient magnetic sequence in a corresponding axis (i.e., z-axis) direction, Gy denotes a gradient magnetic sequence in a corresponding axis (i.e., y-axis) direction, and Gx denotes a gradient magnetic sequence in a corresponding axis (i.e., x-axis) direction. In this case, an abscissa axis of each pulse waveform indicates time, and an ordinate axis of each pulse waveform indicates an intensity of an applied magnetic field.

In the waveforms of FIG. 3, each of an analog-to-digital converter (ADC) and a numerically controlled oscillator (NCO) corresponds to a signal applied to a circuit that converts an analog signal into a digital signal or converts a digital signal into an analog signal. In this case, an abscissa axis of each signal waveform indicates time, and an ordinate axis of each signal waveform indicates an intensity of a voltage applied to each circuit.

When a particular point on a time axis is selected on a screen on which the waveforms of simulated pulse sequences are displayed, information 330 about a corresponding time and each pulse at a corresponding time or level information 350 of a signal may be displayed on the screen. A user checks waveforms and pieces of information of signals in order to verify whether a desired pulse sequence is designed, and when the desired pulse sequence is not designed as a result of the verification, the user corrects a source code so as to design a corrected pulse sequence.

However, correcting a source code for trivial correction and performing simulation are inefficient, and moreover, parameters for determining features of each pulse sequence and signal have a correlation therebetween. Therefore, there are many cases in which the parameters are not independent, and thus, an operation in which a user directly corrects a parameter value of a source code so as to design a desired pulse sequence is difficult work.

Moreover, an operation of checking a main point of a pulse sequence is needed for verifying a designed pulse sequence, and as described above, in a case of selecting and checking only a particular point on a time axis in a screen on which a simulation result is displayed, a user may check a point of interest (POI), such as a start point, end point, or central point of a displayed pulse sequence with the eyes, manually select a time, and calculate information about the POI.

As described above, in a case of manually selecting a main point, there is a very high likelihood that a selected value is inaccurate, and moreover, when a magnification degree of a displayed waveform is relatively low, a case in which it is impossible to check a POI occurs.

Hereinafter, a POI based on various waveforms of a pulse sequence will be described with reference to FIG. 4.

A feature of each pulse sequence for MRI is the most important factor for determining a quality and feature of an acquired MR image, but values of different time domains do not have the same importance, and application times, intensities, and areas of pulses composing each pulse sequence exert an important influence upon a design of a corresponding pulse sequence.

For example, in a process of developing and verifying a pulse sequence, it is important to set a time taken in applying a pulse, a time taken until an RF pulse is applied and then an ADC center is provided, and/or a repetition time TR. In order to check each result, a start point, an end point, and a central point of each pulse, a point at which each pulse is applied and enters a plateau section, and a point at which the plateau section ends are important POIs for a developer or a pulse sequence designer.

Figure 4:
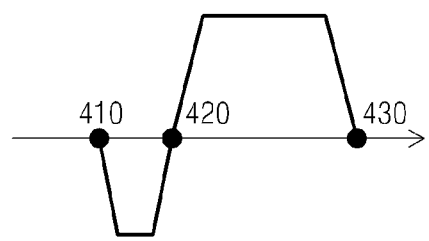
FIG. 4 is a diagram illustrating an example of a point of interest (POI) based on a waveform of a pulse sequence for MRI.
Figure 4:
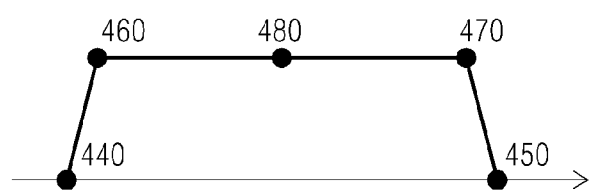
Figure 4:
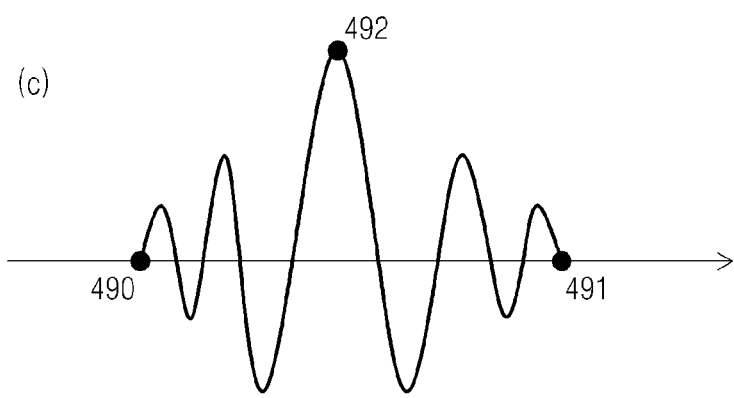

FIG. 4 is a diagram illustrating an example of a POI based on a waveform of a pulse sequence for MRI.

In the exemplary embodiment illustrated in drawing (a) of FIG. 4, each of item 410, item 420, and item 430 corresponds to a respective zero-crossing point of a value of a pulse sequence, and these zero-crossing points 410, 420, and 430 may be POIs. Alternatively, although not shown in drawing (a) of FIG. 4, a point at which a pulse enters a plateau section between point 410 and point 420, a point at which the plateau section ends, a point at which a plateau section between point 420 and point 430 is entered, and a point at which the plateau section ends may also be POIs.

In this case, information, such as an area of a pulse, which is calculated by using a respective time interval between point 410, point 420, and point 430 in addition to a time value of each point, may be additionally used to analyze a pulse sequence.

In the exemplary embodiment illustrated in drawing (b) of FIG. 4, a start point 440, an end point 450, and a central point 480 of each pulse, a point 460 at which each pulse is applied and enters a plateau section, and a point 470 at which the plateau section ends may be POIs. In this case, information about the central point 480, the point 460 at which each pulse is applied and enters the plateau section, and the point 470 at which the plateau section ends, and information, such as an area of a pulse, which is calculated by using an intensity of a magnetic field at the central point 480, may be additionally used.

In the exemplary embodiment illustrated in drawing (c) of FIG. 4, a central point 492, a start point 490, and an end point 491 of a pulse having a sinc function form may be POIs. In this case, a waveform of a sinc function theoretically exists in a negative and positive infinite range, and thus, a start point and an end point may be calculated on the assumption that the waveform of the sinc function does not exist in a section having an intensity of a magnetic field which is equal to or less than a predetermined value.

Each POI may be determined based on a type of a pulse, for example, an RF pulse or a gradient pulse. Further, each POI may be determined based on a waveform of a pulse, for example, a square wave, a chopping wave, a sinc wave, or a sine wave.

If information about a POI of a pulse is previously known in a process of designing a pulse sequence, by analyzing a pulse sequence based on the information about the POI, information about a POI of the designed pulse sequence may be displayed even without performing a selection and calculation operation on the POI. Further, a parameter and a source code for designing a pulse sequence may be more easily verified.

Hereinafter, an MRI apparatus for providing information about a POI of a pulse sequence for MRI, according to an exemplary embodiment, will be described in detail with reference to FIG. 5.

Figure 5:
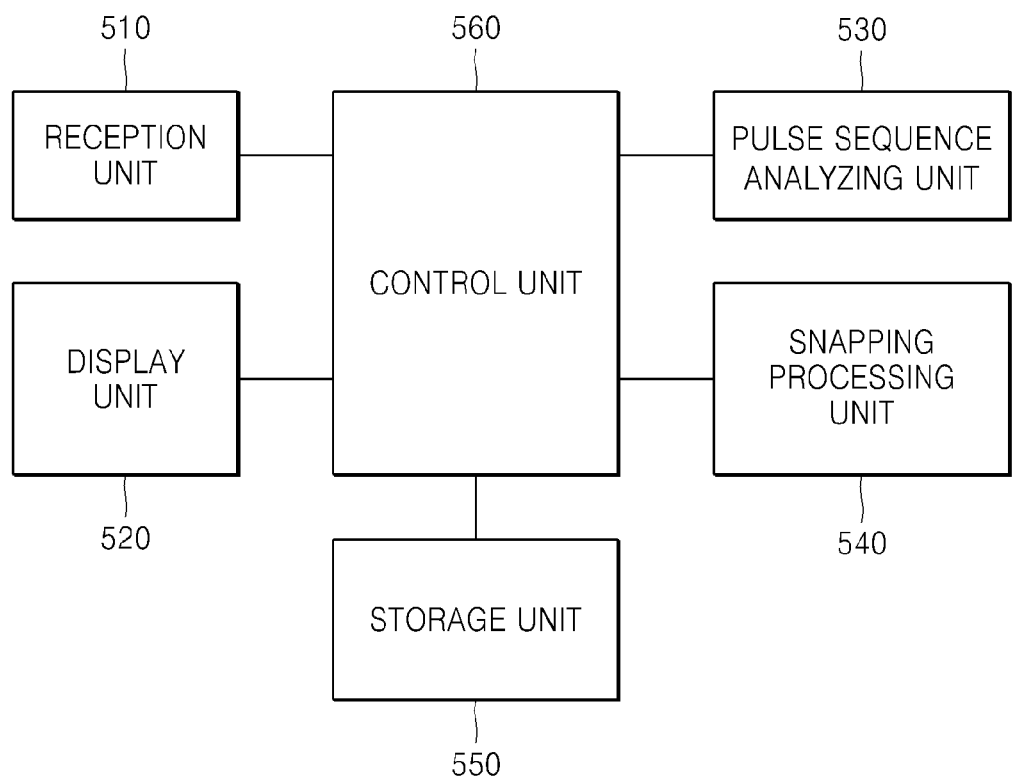
FIG. 5 illustrates an example of an internal configuration of an MRI apparatus, according to an exemplary embodiment.

FIG. 5 illustrates an example of an internal configuration of an MRI apparatus 500 for providing information about a POI of a pulse sequence for MRI, according to an exemplary embodiment.

Hereinafter, the MRI apparatus 500 for providing information about a POI of a pulse sequence for MRI according to an exemplary embodiment is referred to as an MRI apparatus 500.

As illustrated in FIG. 5, the MRI apparatus 500 for providing information about a POI of a pulse sequence, according to an exemplary embodiment, may include a reception unit (also referred to herein as a "receiver") 510, a display unit (also referred to herein as a "display device" and/or as a "display") 520, a pulse sequence analyzing unit (also referred to herein as a "pulse sequence analyzer") 530, a snapping processing unit (also referred to herein as a "snapping processor") 540, a storage unit (also referred to herein as a "storage device" and/or as a "storage") 550, and a control unit (also referred to herein as a "controller") 560.

The MRI apparatus 500 of FIG. 5 may be included in the MRI system of FIG. 1. In detail, the MRI apparatus 500 of FIG. 5 may be included in the operating unit 60 of the MRI system of FIG. 1. Further, the reception unit 510, display unit 520, and storage unit 550 of FIG. 5 may be respectively included in the input unit 66, output unit 64, and memory (not shown) of FIG. 1. In addition, the pulse sequence analyzing unit 530, snapping processing unit 540, and control unit 560 of FIG. 5 may be included in the image processor 62 of FIG. 1. Thus, a description which would be repetitive of that provided above with respect to FIG. 1 is not provided.

The reception unit 510 receives information about a default POI of a pulse sequence and information about an additional POI from a user. Further, according to another exemplary embodiment, in a case in which a marked POI and/or information about the POI is displayed, the reception unit 510 receives a corrected POI and/or information about the corrected POI when the user desires to edit a pulse sequence.

The default POI is a POI which is mainly used based on a kind or waveform of a pulse, and may be predetermined in a pulse sequence design process. Although the additional POI is not the default POI, the additional POI is a point which is especially interesting to the user and/or is to be additionally checked in the pulse sequence design process, and corresponds to a user POI.

A repetition time TR, an echo time TE, a peak value of RC, and/or a central value of an ADC, which is mainly used in a pulse sequence used for MRI, corresponds to a conceptually standardized value, and is treated as an important parameter in most MRI systems.

However, in addition to such values, parts which may be additionally standardized based on a pattern exist in a pulse sequence, and may be treated as an important POI in designing and correcting the pulse sequence.

For example, in a fractional echo or a fractional RF which is used in a fast gradient magnetic echo technique, a central point of a pulse sequence does not match a central point of an ADC, unlike another pulse sequence. In this case, an ADC value at a time which matches a central point of the fractional echo or fractional RF is a main feature of a corresponding pulse sequence, and may be a user POI.

As described above, all parts that correspond to a singularity or main feature of a corresponding pulse sequence do not necessarily qualify as a default POI, but may be user POIs. A user may designate a corresponding point as an additional POI and may more easily check information of the corresponding point. In this case, the reception unit 510 may include an input unit such as, for example, any one or more of a keyboard, a mouse, a touch pen, and a motion, but the input unit is not limited thereto.

The pulse sequence analyzing unit 530 analyzes each pulse sequence with respect to a time axis and extracts time information of a point corresponding to a POI of each pulse sequence, intensity information of an applied signal, and intensity information of an applied magnetic field, based on the information about the default POI and the information about the additional POI, which are received by the reception unit 510.

The display unit 520 displays a waveform of each pulse sequence on a screen, based on the analysis performed by the pulse sequence analyzing unit 530, and marks a POI on each pulse sequence displayed on the screen. Here, marking may refer to a process of displaying a POI in conjunction with corresponding time information so that a POI of a pulse sequence is distinguished from other points in a user interface screen. For example, the display unit 520 may mark a POI on a pulse sequence by using any one or more of a color, a sign, and a special letter.

When a pointer or cursor of an input device is located within a predetermined range from one of the POIs marked on a pulse sequence, the snapping processing unit 540 matches the pointer or cursor of the input device with a closest POI and enables information of the POI to be displayed in an interoperation with the display unit 520.

Moreover, according to another exemplary embodiment, the snapping processing unit 540 further displays information of a matched POI and additional information associated with the matched POI. In this case, the additional information associated with the POI may include a time corresponding to the POI and information about a pulse instead of a pulse corresponding to the POI.

Moreover, according to another exemplary embodiment, when there is an external input, the snapping processing unit 540 matches a pointer or cursor of an input device, matching a closest POI, with a next POI which is determined based on the external input.

Moreover, according to another exemplary embodiment, the snapping processing unit 540 may be activated or deactivated based on an external input. In this case, a pointer or cursor of an input device may be variably expressed in an activated state and a deactivated state.

The storage unit 550 stores various pieces of information so as to determine and display various pieces of information which are necessary for providing information about a POI of a pulse sequence. In particular, the information about the default POI and the information about the additional POI (which are received by the reception unit 510), the additional information about each pulse sequence, and the analysis result of the pulse sequence analyzing unit 530 may be stored in a system.

The control unit 560 controls an overall operation of the MRI apparatus 500. In detail, the control unit 560 may control the reception unit 510, the display unit 520, the pulse sequence analyzing unit 530, the snapping processing unit 540, and the storage unit 550, in order for a user to more easily check POI information of a pulse sequence and edit the pulse sequence by using an analysis result of the pulse sequence and received information about a default POI and an additional POI.

Hereinafter, a method for providing information about a POI of a pulse sequence for MRI, according to an exemplary embodiment, will be described in detail with reference to FIGS. 6 and 7.

Figure 6:
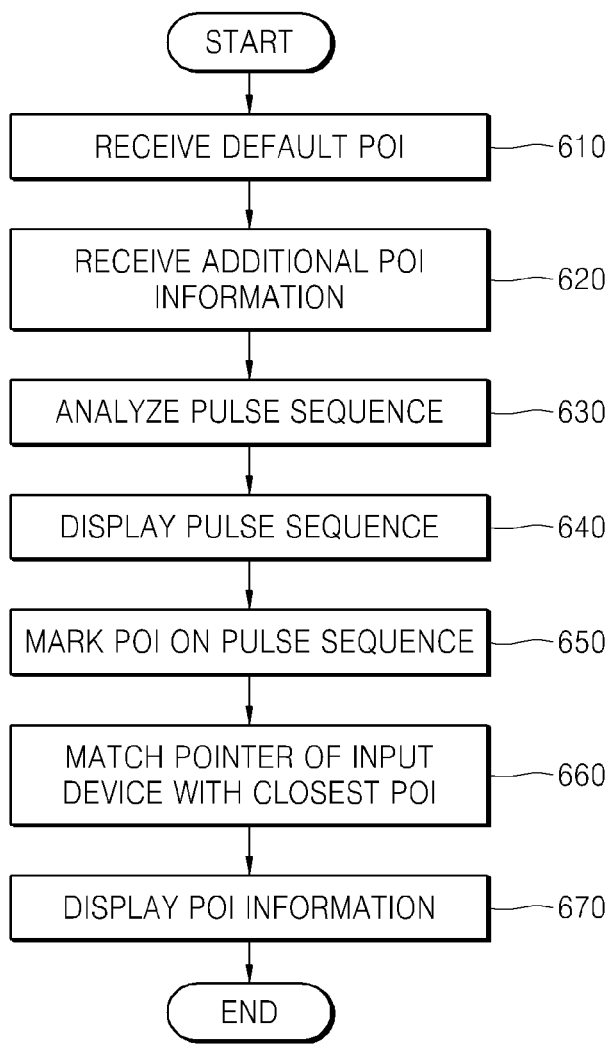
FIG. 6 is a flowchart of a method for providing information about a POI of a pulse sequence for MRI, according to an exemplary embodiment.

FIG. 6 is a flowchart of a method for providing information about a POI of a pulse sequence for MRI, according to an exemplary embodiment.

In operation 610, the MRI apparatus 500 receives information about a default POI by using the reception unit 510. As described above, the default POI is a POI which is mainly used based on a type or waveform of a pulse, and may be predetermined in a pulse sequence design process. In this case, the information about the default POI may be received in a state of being added into a source code for designing a pulse sequence, or may be received independently from the source code for designing the pulse sequence.

In operation 620, the MRI apparatus 500 receives information about an additional POI by using the reception unit 510. As described above, although the additional POI is not the default POI, the additional POI is a point which is especially interesting to the user or is to be additionally checked in the pulse sequence design process, and refers to a user's POI.

A repetition time TR, an echo time TE, a peak value of RC, and/or a central value of an ADC, which is mainly used in a pulse sequence used for MRI, corresponds to a conceptually standardized value, and is treated as an important parameter in most MRI systems.

However, in addition to such values, parts which may be additionally standardized based on a pattern exist in a pulse sequence, and may be treated as an important POI in designing and correcting the pulse sequence.

For example, in a fractional echo or a fractional RF, which is used in the fast gradient magnetic echo technique, a central point of a pulse sequence does not match a central point of an ADC, unlike another pulse sequence. In this case, an ADC value at a time which matches a central point of the fractional echo or fractional RF is a main feature of a corresponding pulse sequence, and may be a user POI.

As described above, all parts that correspond to a singularity or main feature of a corresponding pulse sequence do not necessarily qualify as a default POI, but may be designated as user POIs. A user may designate a corresponding point as an additional POI, and may thusly more easily check information of the corresponding point.

In operation 630, the MRI apparatus 500 according to an exemplary embodiment analyzes a pulse sequence by using a source code for designing the pulse sequence, the default POI information, and the additional POI information. An operation of analyzing the pulse sequence includes an operation of calculating a value of each pulse sequence with respect to a time axis, an operation of analyzing a correlation between pulse sequences, an operation of extracting a POI of each pulse sequence, and/or an operation of acquiring information about the POI. A numerical value and information about a POI are systematically analyzed and calculated, and thus, more accurate information is acquired than a case in which a user manually selects and calculates the numerical value and the information.

The MRI apparatus 500 displays the pulse sequence on the display unit 520 on the basis of a pulse sequence analysis result in operation 640, and marks a POI on the displayed pulse sequence in operation 650. A method for marking the POI on the displayed pulse sequence may include a representative operation of marking the POI by using a separate figure or color, but the method for marking is not limited thereto. For example, the POI may be marked so that a default POI is distinguished from an additional POI.

In operation 660, the MRI apparatus 500 matches a pointer of an input device with a POI that is closest to a position of the pointer. Such an operation is referred to as snapping.

By using a distance from each POI to a pointer of an input device such as a mouse which is displayed by the display unit 520, the snapping processing unit 540 matches the pointer of the input unit with a closest POI when a distance from the pointer of the input device to a POI is within a predetermined distance. In this case, by changing a marking position of the matched POI or a shape of the pointer of the input device which is displayed by the display unit 520, a user more easily determines whether a current state is a snapping state, and thereby distinguishes the matched POI from other POIs.

In operation 670, the MRI apparatus 500 according to an exemplary embodiment displays information of the POI (i.e., a snapped POI) to which the pointer of the input device has been matched, on the display unit 520. Via operations 660 and 670, the snapping processing unit 540 enables the user to more easily check more accurate information about a POI even without a need for a manual selection of the POI.

If the user does not desire to use a snapping function, the snapping function may be deactivated by providing an external input, and a snapping function in a deactivated state may be again activated by providing another external input.

Figure 7:
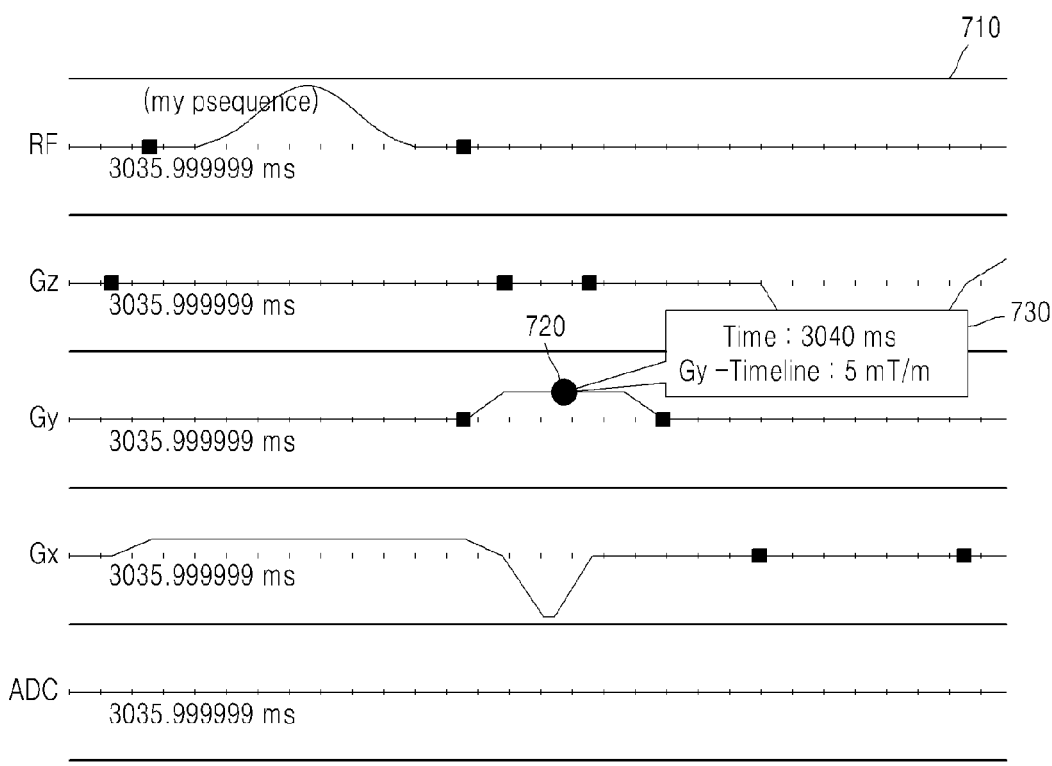
FIG. 7 is an example of a screen on which information about a POI of a pulse sequence for MRI is displayed, according to an exemplary embodiment.

FIG. 7 is an example of a screen on which information about a POI of a pulse sequence for MRI is displayed, according to an exemplary embodiment.

In a screen 710 of FIG. 7 on which information about a POI of a pulse sequence for MRI is displayed, points set as POIs are a start point and an end point of an RF pulse sequence and a start point, an end point, and a central point of Gy, and the POIs are marked as a square. A POI (i.e., a snapped POI 720) matching the pointer of the input device is a central point of Gy and is marked as a circle in order to be distinguished from other POIs.

When a snapped POI 720 is selected and displayed, information of the snapped POI is displayed as illustrated in item 730, thereby enabling a user to check the information. In the exemplary embodiment of FIG. 7, only a time and an intensity value of a magnetic field of the snapped POI 720 are illustrated, but optionally, a magnetic field change within a predetermined time range from a corresponding time and information of a time section having the same intensity of a magnetic field may be displayed together, based on a setting. In addition, a method for displaying information about the snapped POI generally uses at least one of a popup window and a tooltip box, but the display of information is not limited thereto.

Hereinafter, a method for providing information about a POI of a pulse sequence for MRI, according to another exemplary embodiment, will be described in detail with reference to FIGS. 8 to 14.

Figure 8:
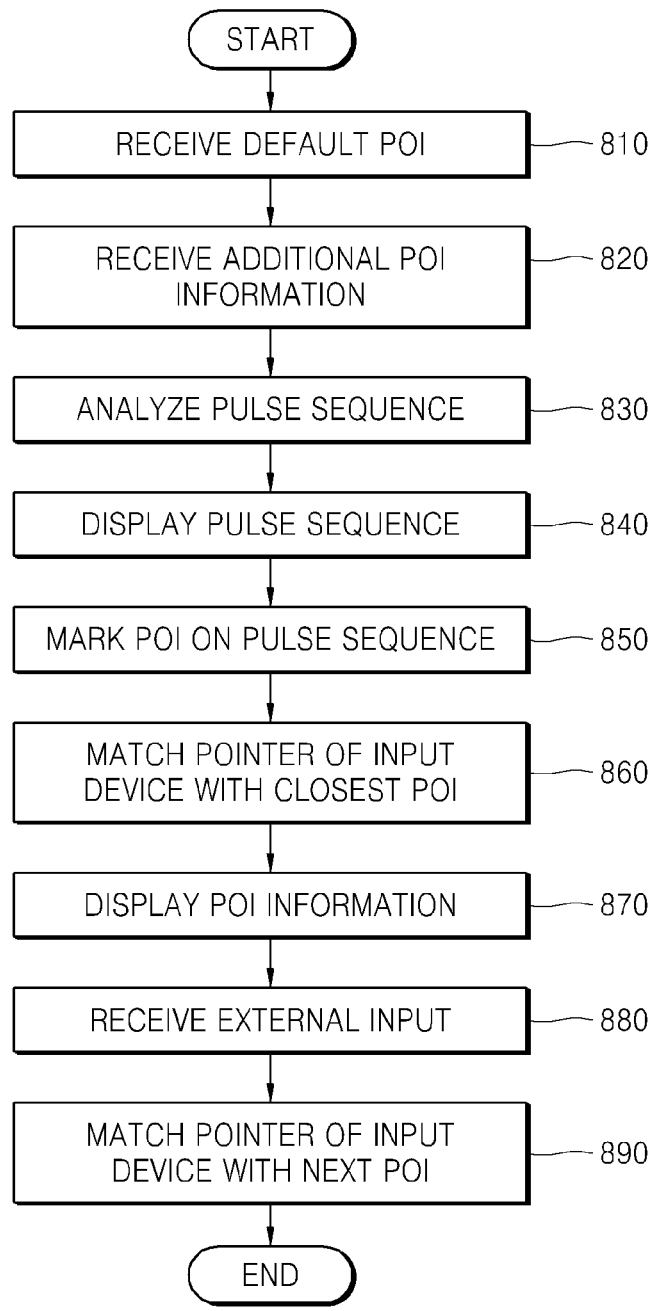
FIG. 8 is a flowchart of a method for providing information about a POI of a pulse sequence for MRI, according to another exemplary embodiment.

FIG. 8 is a flowchart of a method for providing information about a POI of a pulse sequence for MRI, according to another exemplary embodiment.

Operations 810 to 870 according to the exemplary embodiment of FIG. 8 are the same as operations 610 to 670 according to the exemplary embodiment of FIG. 6.

In operations 810 and 820, the MRI apparatus 500 receives information about a default POI and information about an additional POI by using the reception unit 510.

The MRI apparatus 500 analyzes a pulse sequence by using a source code for designing the pulse sequence, the default POI information, and the additional POI information in operation 830, displays the pulse sequence on the display unit 520 based on a pulse sequence analysis result in operation 840, and marks a POI on the displayed pulse sequence in operation 850.

The MRI apparatus 500 according to an exemplary embodiment matches a pointer of an input device with a POI that is closest to a position of the pointer in operation 860, and displays information of the POI (i.e., a snapped POI) to which the pointer of the input device has been matched, on the display unit 520 in operation 870.

A user may desire to check information of a snapped POI and then additionally check information of another POI. Generally, information of a temporally adjacent POI has a high correlation with information of a snapped POI, and thus, there is a high probability that information of an adjacent POI is additionally checked.

Therefore, when an external input is received from the user via the reception unit 510 in operation 880, the snapping processing unit 540 of the MRI apparatus 500 may match a pointer of an input device with a next POI in operation 890.

Although not shown in FIG. 8, when the pointer of the input device matches a next POI, the snapping processing unit 540 may display information of the next POI on the display unit 520. In this aspect, the next POI is changed to a snapped POI.

In FIG. 8, an exemplary embodiment is illustrated in which when there is an external input, the pointer of the input device matches the pointer with a next POI. However, according to another exemplary embodiment, when there is an external input, the pointer of the input device may match the pointer with a previous POI based on the kind of the external input. For example, when an 'f' button is input via a keyboard that is a letter input device, the pointer of the input device may match the pointer with the next POI, and when an 'r' button is input, the pointer of the input device may match the pointer with the previous POI.

Figure 9:
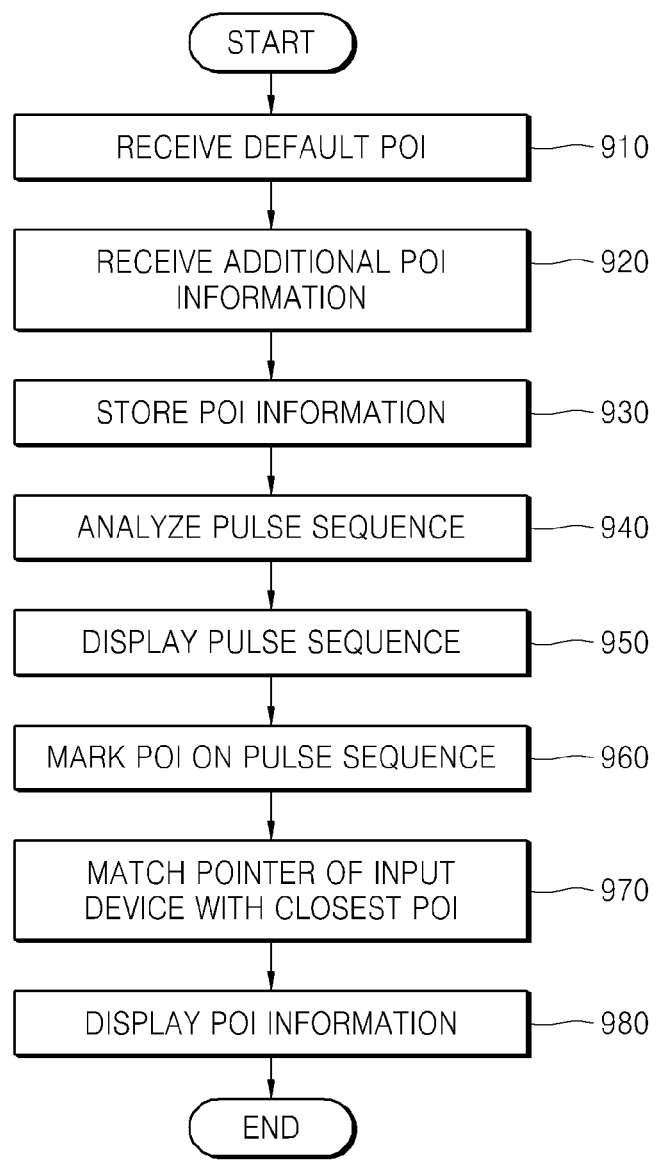
FIG. 9 is a flowchart of a method for providing information about a POI of a pulse sequence for MRI, according to another exemplary embodiment.

FIG. 9 is a flowchart of a method for providing information about a POI of a pulse sequence for MRI, according to another exemplary embodiment.

Operations 910 to 980 according to the exemplary embodiment of FIG. 9 are similar to operations 610 to 670 according to the exemplary embodiment of FIG. 6.

In the exemplary embodiment of FIG. 9, operation 930 of storing POI information is additionally performed, and corresponds to an operation of storing default POI information of a pulse sequence and additional POI information in the storage unit 550. According to another exemplary embodiment, the stored default POI information and additional POI information may be analyzed, thereby enabling a system to recommend a POI.

Moreover, although not shown in FIG. 9, information about a POI which is calculated as a pulse sequence analysis result may be stored in the storage unit 550, and may be stored in association with a stored POI.

Figure 10:
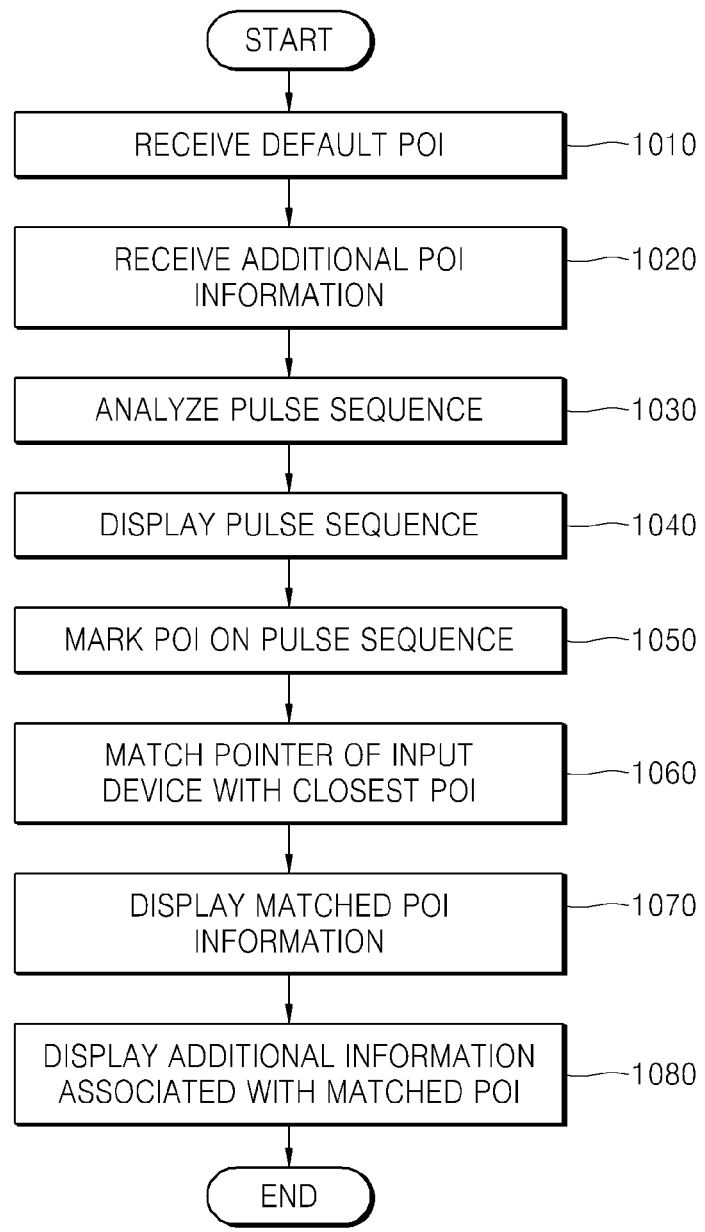
FIG. 10 is a flowchart of a method for providing information about a POI of a pulse sequence for MRI, according to another exemplary embodiment.

FIG. 10 is a flowchart of a method for providing information about a POI of a pulse sequence for MRI, according to another exemplary embodiment.

Operations 1010 to 1070 according to the exemplary embodiment of FIG. 10 are the same as operations 610 to 670 according to the exemplary embodiment of FIG. 6.

In operations 1010 and 1020, the MRI apparatus 500 receives information about a default POI and information about an additional POI by using the reception unit 510.

The MRI apparatus 500 analyzes a pulse sequence by using a source code for designing the pulse sequence, the default POI information, and the additional POI information in operation 1030, displays the pulse sequence on the display unit 520 based on a pulse sequence analysis result in operation 1040, and marks a POI on the displayed pulse sequence in operation 1050.

The MRI apparatus 500 according to an exemplary embodiment matches a pointer of an input device with a POI that is closest to a position of the pointer in operation 1060, and displays information of a snapped POI on the display unit 520 in operation 1070.

In MRI, an MR signal corresponds to a response signal to an RF pulse sequence, and also corresponds to a result of an interaction with other applied signals in addition to the RF pulse sequence. In addition to information about a snapped POI, the presence of another signal based on a corresponding time and factors, composing a pulse sequence, such as an intensity, repetition time TR, and echo time TE of the other signal, affect the MR signal.

Therefore, there are many cases in which a user desires to further check additional information associated with a snapped POI, in addition to information of the snapped POI. Unlike the exemplary embodiment of FIG. 6, according to the exemplary embodiment of FIG. 10, in addition to information of a snapped POI, additional information associated with the snapped POI may be further displayed in operation 1080, thereby enabling the user to easily check the additional information.

Figure 11:
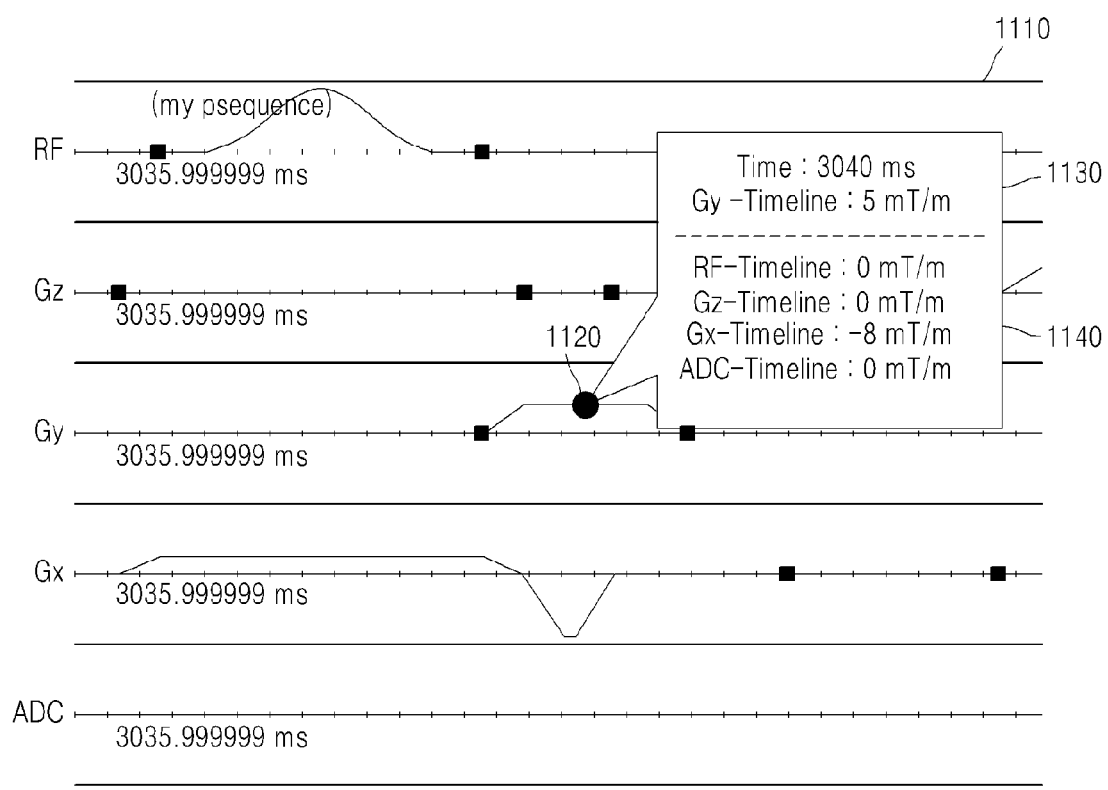
FIG. 11 is an example of a screen on which information about a POI of a pulse sequence for MRI and additional information are displayed, according to an exemplary embodiment.

FIG. 11 is an example of a screen on which information about a POI of a pulse sequence for MRI and additional information are displayed, according to an exemplary embodiment.

A screen 1110 of FIG. 11 is a screen on which information about a POI of a pulse sequence for MRI and additional information are displayed according to the exemplary embodiment of FIG. 10, and screen 1110 is similar to the screen 710 of FIG. 7. However, in addition to information 1130 of a snapped POI 1120, additional information 1140 is further displayed.

At 3040 ms that is a time of the snapped POI 1120, an RF pulse, a Gz pulse, and an ADC signal are not applied, and only a Gx pulse having an intensity of −8 mT is applied. The fact that the RF pulse and the Gz pulse are not applied at the time of the snapped POI 1120 acts as an important factor in designing and analyzing a pulse sequence for MRI.

In the exemplary embodiment of FIG. 11, intensities of other signals are designated as additional information at 3040 ms that is the time of the snapped POI 1120, but the additional information is not limited thereto.

Figure 12:
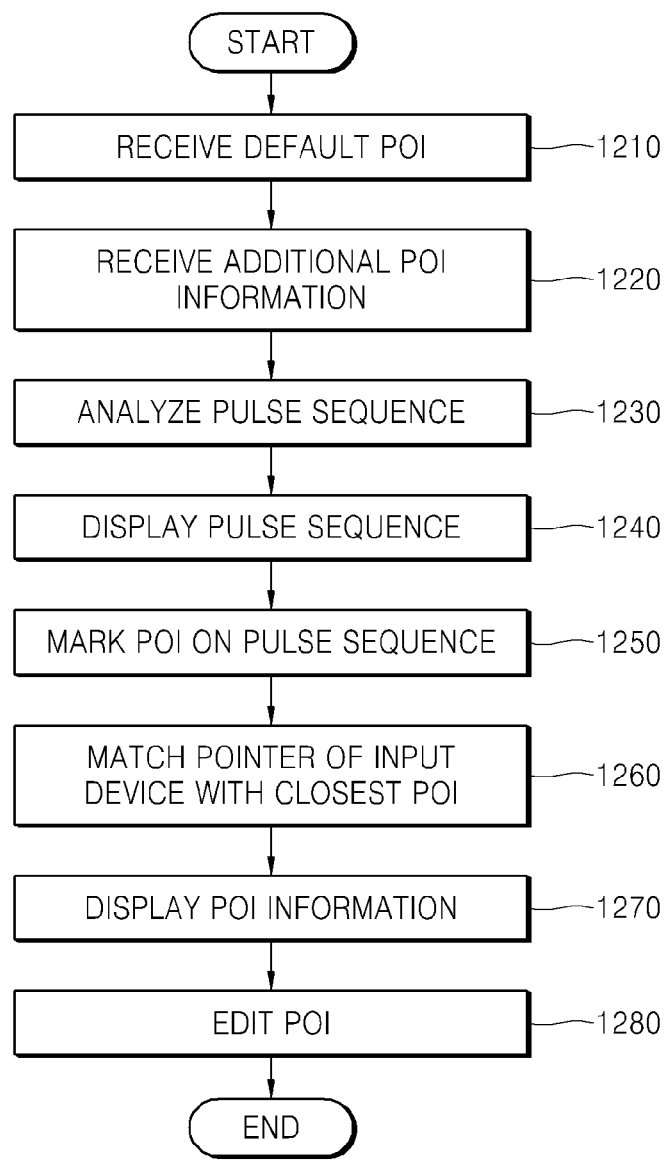
FIG. 12 is a flowchart of a method for providing information about a POI of a pulse sequence for MRI, according to another exemplary embodiment.

FIG. 12 is a flowchart of a method for providing information about a POI of a pulse sequence for MRI, according to another exemplary embodiment.

Operations 1210 to 1270 according to the exemplary embodiment of FIG. 12 are the same as operations 610 to 670 according to the exemplary embodiment of FIG. 6.

In operations 1210 and 1220, the MRI apparatus 500 receives information about a default POI and information about an additional POI by using the reception unit 510.

The apparatus 500 for providing information about a POI of a pulse sequence for MRI analyzes a pulse sequence by using a source code for designing the pulse sequence, the default POI information, and the additional POI information in operation 1230, displays the pulse sequence on the display unit 520 based on a pulse sequence analysis result in operation 1240, and marks a POI on the displayed pulse sequence in operation 1250.

The MRI apparatus 500 according to an exemplary embodiment matches a pointer of an input device with a POI that is closest to a position of the pointer in operation 1260, and marks information of a snapped POI on the display unit 520 in operation 1270.

In designing a pulse sequence for MRI, it is impossible to design an accurate pulse sequence in a first iteration. Therefore, a pulse sequence is designed by using an arbitrary value or an approximate value for the first iteration, and the designed pulse sequence is edited and corrected several times.

According to the exemplary embodiment illustrated in FIG. 12, accurate information about a POI of a pulse sequence is more easily checked, and moreover, the pulse sequence may be more easily edited, by using the checked result in operation 1280.

Figure 13:
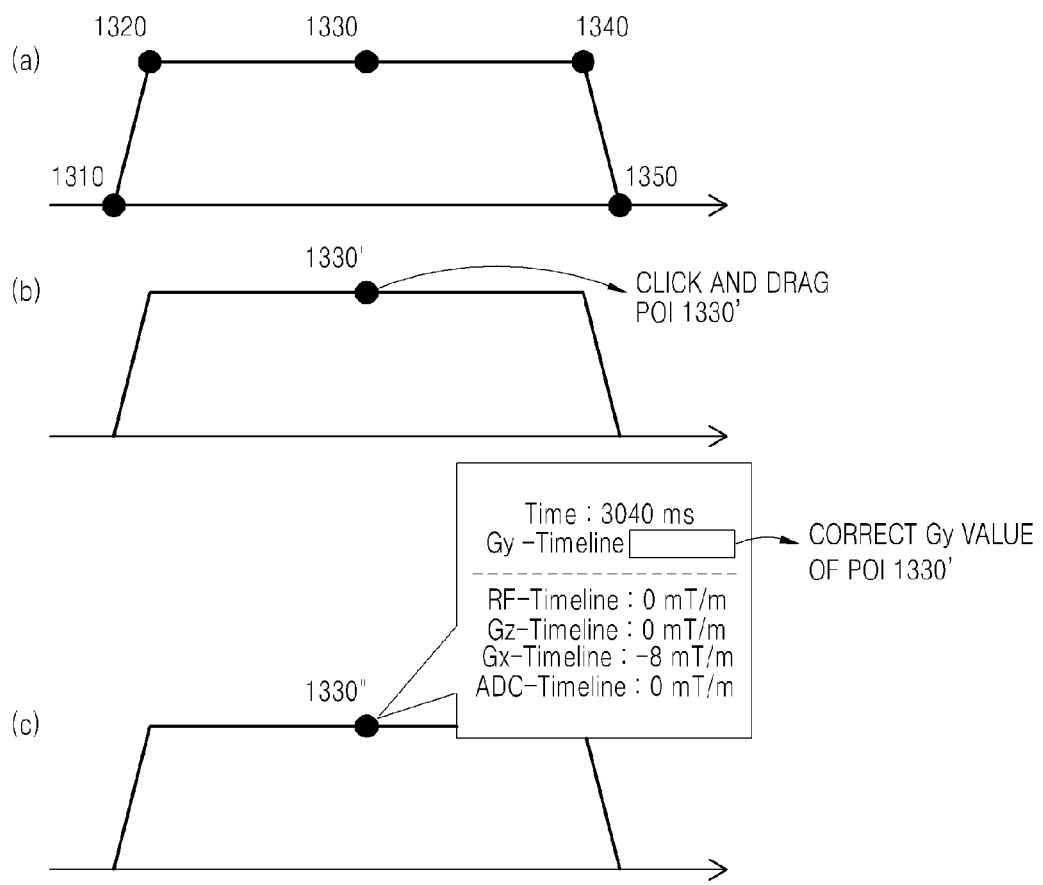
FIG. 13 illustrates an example of a method for editing a pulse sequence for MRI, according to an exemplary embodiment.

FIG. 13 illustrates an example of a method for editing a pulse sequence for MRI, according to an exemplary embodiment.

Drawing (a) of FIG. 13 is a diagram illustrating a marked default POI and an additional POI of a pulse sequence, according to an exemplary embodiment. In drawing (a) of FIG. 13, a pulse has a trapezoidal shape, and a default POI and an additional POI are a start point 1310, an end point 1350, a start point 1320 of a plateau section, and an end point 1340 and a central point 1330 of the plateau section.

According to drawing (b) of FIG. 13, among the POIs illustrated in drawing (a) of FIG. 13, the central point 1330 corresponds to a snapped POI 1330'. A user may check the snapped POI 1330' and information thereof, and when it is required to correct the snapped POI 1330', the user may click and drag the snapped POI 1330' on a screen by using a mouse, and then correct the snapped POI 1330' itself to edit the pulse sequence.

According to drawing (c) of FIG. 13, among the POIs illustrated in drawing (a) of FIG. 13, the central point 1330 corresponds to a snapped POI 1330". The user may check the snapped POI 1330" and information thereof, and when it is required to correct the snapped POI 1330", the user may correct a numerical value, corresponding to the POI information and additional information associated with the snapped POI 1330", in order to edit the pulse sequence.

Figure 14:
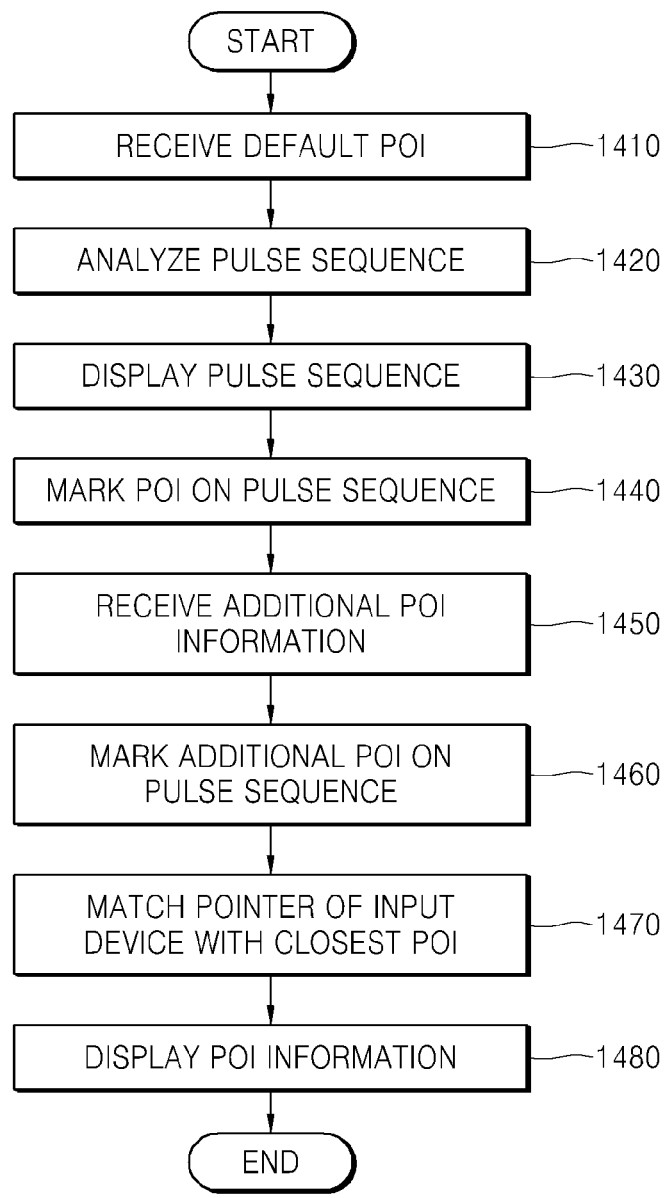
FIG. 14 is a flowchart of a method for providing information about a POI of a pulse sequence for MRI, according to another exemplary embodiment.

FIG. 14 is a flowchart of a method for providing information about a POI of a pulse sequence for MRI, according to another exemplary embodiment.

As described above, although the additional POI is not the default POI, the additional POI is a point which is especially interesting to the user or is to be additionally checked in the pulse sequence design process, and refers to a user's POI.

A repetition time TR, an echo time TE, a peak value of RC, or a central value of an ADC, which is mainly used in a pulse sequence used for MRI, corresponds to a conceptually standardized value, and is treated as an important parameter in most MRI systems.

However, in addition to such values, parts which may be additionally standardized based on a pattern exist in a pulse sequence, and may be treated as an important POI in designing and correcting the pulse sequence.

For example, in a fractional echo or a fractional RF, which is used in the fast gradient magnetic echo technique, a central point of a pulse sequence does not match a central point of an ADC, unlike another pulse sequence. In this case, an ADC value at a time which matches a central point of the fractional echo or fractional RF is a main feature of a corresponding pulse sequence, and may be designated as a user POI.

As described above, all parts that correspond to a singularity or main feature of a corresponding pulse sequence do not necessarily qualify as a default POI, but instead may be designated as user POIs. A user may designate a corresponding point as an additional POI, and may thusly more easily check information of the corresponding point.

A case in which the user does not determine a POI to be designated as an additional POI before analyzing a pulse sequence, or a case in which the additional POI is input before analyzing the pulse sequence but the number of POIs to be designated as the additional POI after analyzing the pulse sequence increases, may occur.

In this case, an operation of additionally inputting information about the additional POI may be performed, even after a POI is marked on the pulse sequence.

FIG. 14 is a flowchart of a method for providing information about a POI of a pulse sequence for MRI when the user does not determine a POI to be designated as an additional POI before analyzing the pulse sequence.

The MRI apparatus 500 receives information about a default POI by using the reception unit 510 in operation 1410, and analyzes a pulse sequence by using a source code for designing the pulse sequence and the default POI information in operation 1420.

The MRI apparatus 500 displays the pulse sequence on the display unit 520 based on a pulse sequence analysis result in operation 1430, and marks the default POI on the displayed pulse sequence in operation 1440.

The user may check the pulse sequence and the default POI and determine an additional POI. The MRI apparatus 500 receives information about the additional POI by using the reception unit 510 in operation 1450, and marks the additional POI on the displayed pulse sequence in operation 1460. Subsequently, in operation 1470, the snapping processing unit 540 matches a pointer of an input unit with a closest POI when a distance from the pointer of the input device to a POI is within a predetermined distance. In operation 1480, the snapping processing unit 540 displays information of the POI (i.e., a snapped POI), to which the pointer of the input device is matched, on the display unit 520.

Moreover, although not shown in FIG. 14, when the user determines and inputs the additional POI information before analyzing the pulse sequence but the additional POI is enlarged, an operation of receiving the additional POI information may be further performed between operation 1410 of receiving the default POI information and operation 1420 of analyzing the pulse sequence, and the additional POI is marked in operation 1440 of marking the default POI on the pulse sequence.

Figure 15:
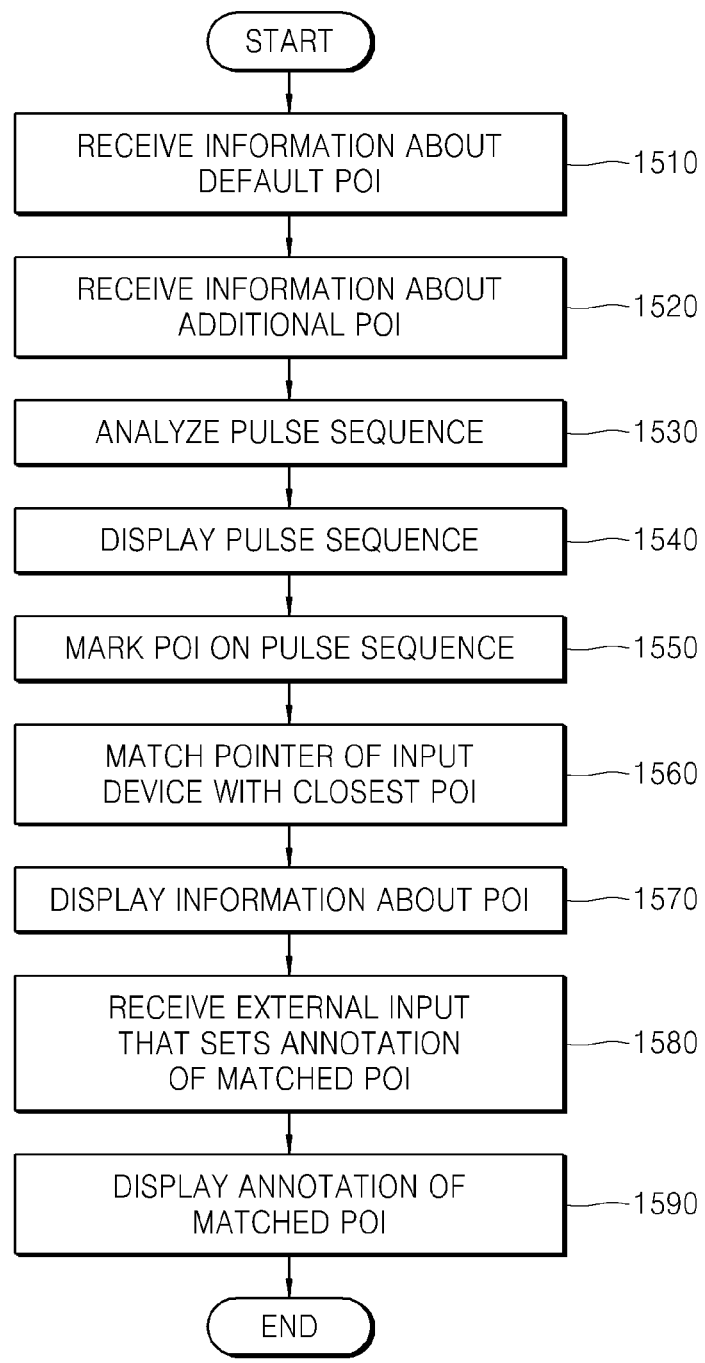
FIG. 15 is a flowchart of a method for providing information about a POI of a pulse sequence for MRI, according to another exemplary embodiment.

FIG. 15 is a flowchart of a method for providing information about a POI of a pulse sequence for MRI, according to another exemplary embodiment.

Operations 1510 to 1570 according to the exemplary embodiment of FIG. 15 may correspond to operations 610 to 670 according to the exemplary embodiment of FIG. 6. Thus, descriptions repetitive of operations 610 to 670 are not provided.

The MRI apparatus 500, according to an exemplary embodiment, may set an annotation of a POI.

The annotation of the POI used herein refers to text information in which a POI or a pulse is described, may be set by a user, and may be displayed on a user interface screen. Further, the annotation of the POI may include any one or more of various types of text information, such as a special sign, an equation, and/or a figure.

In detail, in operation 1580, the MRI apparatus 500 may receive, via the reception unit 510, an external input that sets an annotation of the POI to which the pointer is matched in operation 1560. In operation 1590, the display unit 520 may display the annotation of the POI to which the pointer is matched in operation 1560.

For example, the MRI apparatus 500 may generate the user interface screen in order for the user to enter text information, such as the POI and a pulse, in the annotation of the POI.

In detail, for example, the user may enter a characteristic of the pulse in the annotation. When a waveform of the pulse is laterally symmetric with respect to a central point of the pulse, the user may enter 'symmetry' or 'asymmetry=0.5' in an annotation of a POI which is disposed at the central point of the pulse.

Alternatively, when a maximum value of the pulse exists at a left side with respect to the central point of the pulse, the user may enter 'asymmetry' or 'asymmetry <0.5' in the annotation of the POI which is disposed at the central point of the pulse.

Alternatively, when the maximum value of the pulse exists at a right side with respect to the central point of the pulse, the user may enter 'asymmetry' or 'asymmetry >0.5' in the annotation of the POI which is disposed at the central point of the pulse.

In addition, the MRI apparatus 500 may provide the user interface screen, in order for the user to enter a name or a characteristic of the POI in the annotation of the POI.

Figure 16A:
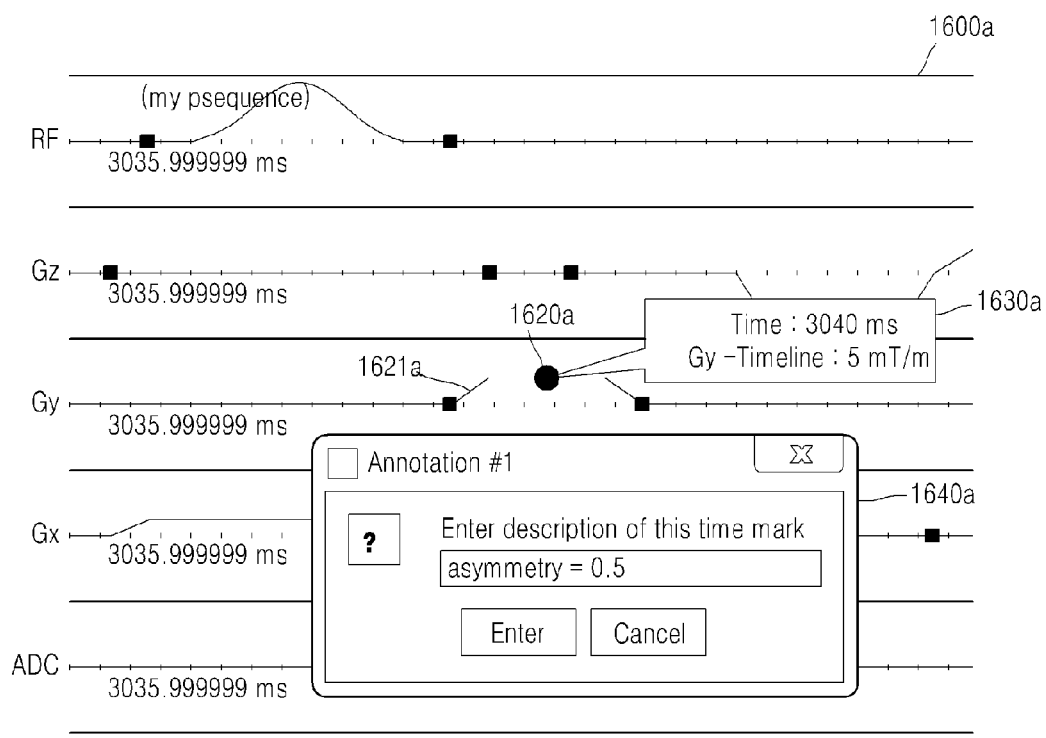
FIGS. 16A and 16B are examples of screens on which an annotation of a POI of a pulse sequence for MRI is displayed, according to an exemplary embodiment.
Figure 16B:
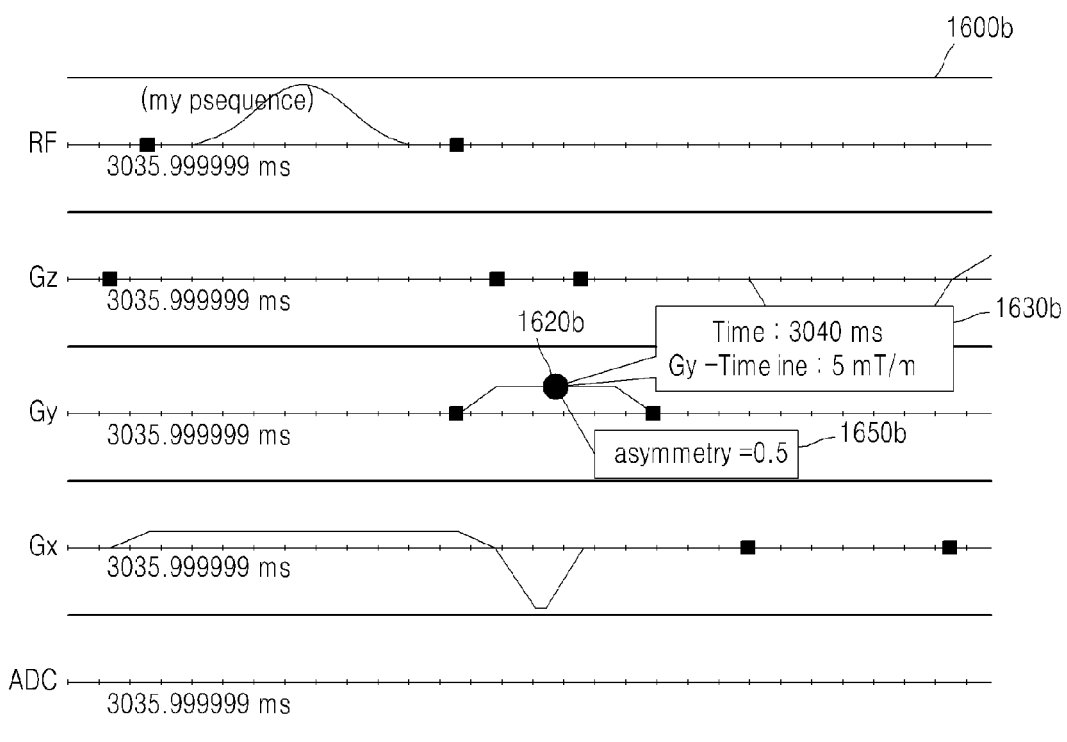

FIGS. 16A and 16B illustrate examples of screens on which an annotation of a POI of a pulse sequence for MRI is displayed, according to an exemplary embodiment.

In particular, FIG. 16A shows a user interface screen 1600a which includes a popup window 1640a for setting an annotation of a POI.

In detail, when the snapping processing unit 540 matches a pointer of an input device with a POI 1620a, information 1630a of the matched POI may be displayed by the display unit 520, and the popup window 1640a for setting an annotation of the matched POI 1620a may be displayed on the user interface screen 1600a.

The matched POI 1620a corresponds to a central point of a Gy pulse 1621a. A user may enter 'asymmetry' in the annotation via the popup window 1640a, for showing an asymmetric characteristic of the Gy pulse 1621a.

Moreover, FIG. 16B shows a user interface screen 1600b on which an annotation 1650b of a POI 1620b is displayed. The display unit 520 may display the annotation 1650b of the POI 1620b together with or independently from information 1630b about the POI 1620b.

The user may more efficiently edit a pulse sequence by using the annotation 1650b of the POI 1620b.

Figure 17:
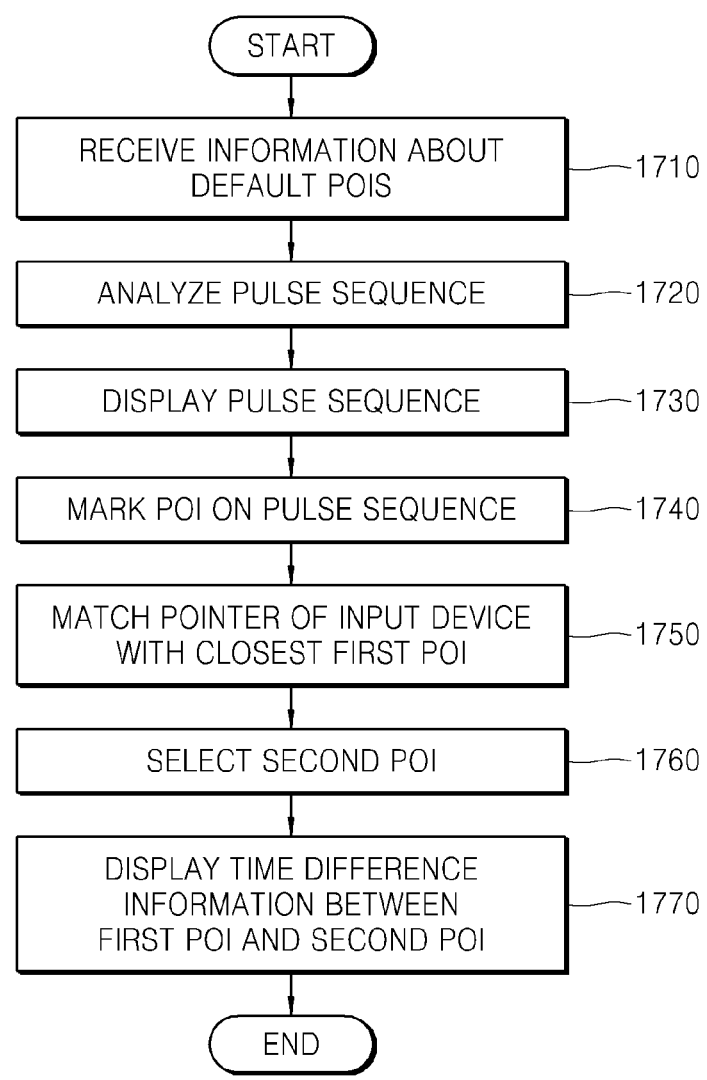
FIG. 17 is a flowchart of a method for providing information about a POI of a pulse sequence for MRI, according to another exemplary embodiment.

FIG. 17 is a flowchart of a method for providing information about a POI of a pulse sequence for MRI, according to another exemplary embodiment.

A user may measure a time differently as between one POI and another POI, for writing or editing a pulse sequence. For example, the user may measure TR or TE, for acquiring a T1 weighted image and/or a T2 weighted image. In detail, as described above, a repetition time (TR) decreases a longitudinal relaxation time (T1) effect, and a time to echo (TE) decreases a traverse relaxation time (T2) effect. Therefore, the user may measure the TR and the TE, and appropriately adjusts the measured TR and TE, thereby acquiring the T1 weighted image and/or the T2 weighted image which is applied for clinical medicine.

The MRI apparatus 500, according to an exemplary embodiment, accurately measures a time difference between two POIs by using a snapping function. Hereinafter, an operation of the MRI apparatus 500 which measures a time difference between two POIs will be described in detail with reference to FIGS. 17 to 20.

In operation 1710, the method for providing information about a POI of a pulse sequence for MRI according to another exemplary embodiment may receive information about a plurality of POIs, which plurality includes at least one default POI or at least one additional POI. Further, operation S1710 may be performed by the reception unit 510 of the MRI apparatus 500. In detail, the reception unit 510 may receive the information about the plurality of POIs of operation 1710.

Operation 1710 of FIG. 17 includes the same technical spirit as that of operations 610 and 620 of FIG. 6. In detail, the default POI and additional POI of operation 1710 may correspond to the default POI of operation 610 and the addition POI of operation 620. Thus, a description repetitive of operation 610 is not provided.

In operation 1720, the method for providing information about a POI of a pulse sequence for MRI according to another exemplary embodiment may analyze at least one pulse sequence of operation 1710. Further, operation 1720 may be performed by the pulse sequence analyzing unit 530 of the MRI apparatus 500.

Operation 1720 of FIG. 17 includes the same technical spirit as that of operation 630 of FIG. 6. Thus, a description repetitive of operation 630 is not provided.

In operation 1730, the method for providing information about a POI of a pulse sequence for MRI according to another exemplary embodiment may display a user interface screen including at least one pulse sequence, based on a result of the analysis of operation 1720. Further, in operation 1740, the method may mark a plurality of POIs on the displayed at least one pulse sequence. In addition, operation 1740 may be performed by the display unit 520 of the MRI apparatus 500. In detail, the display unit 520 may display the user interface screen, and mark the plurality of POIs on the pulse sequence.

Operations 1730 and 1740 of FIG. 17 include the same technical spirit as that of operations 640 and 650 of FIG. 6. In detail, the pulse sequence display and marked POIs of operations 1730 and 1740 may correspond to the pulse sequence display and marked POI of operations 640 and 650. Thus, a description repetitive of operations 640 and 650 is not provided.

The method for providing information about a POI of a pulse sequence for MRI according to another exemplary embodiment may further include operation 1750 in which, when a pointer is disposed within a predetermined range from at least one of the plurality of POIs in the user interface screen the pointer is matched with a closest first POI of the plurality of POIs. Further, operation 1750 may be performed by the snapping processing unit 540 of the MRI apparatus 500.

Operation 1750 of FIG. 17 includes the same technical spirit as that of operation 660 of FIG. 6. In detail, the first POI of operation 1750 may correspond to the matched POI of operation 660. Thus, a description repetitive of operation 660 is not provided.

In operation 1760, the method for providing information about a POI of a pulse sequence for MRI according to another exemplary embodiment may select a second POI which is different from the first POI from among the plurality of POIs. Further, operation 1760 may be performed by the snapping processing unit 540. A method in which the snapping processing unit 540 selects the second POI will be described in detail with reference to FIG. 18.

In operation 1770, the method for providing information about a POI of a pulse sequence for MRI according to another exemplary embodiment may generate time difference information which relates to a difference between a time corresponding to the first POI and a time corresponding to the second POI, and display the time difference information on the user interface screen. Further, operation 1770 may be performed by the control unit 560.

In particular, the user accurately selects two POIs by using a snapping function, and acquires accurate time difference information as between the selected two POIs. For example, when the user clicks a pointer, drags the pointer from a matched POI, and moves the pointer to a next POI, the MRI apparatus 500 may display time difference information as between the two POIs in the display unit 520.

The user efficiently edits a pulse sequence with reference to the displayed time difference information.

Figure 18A:
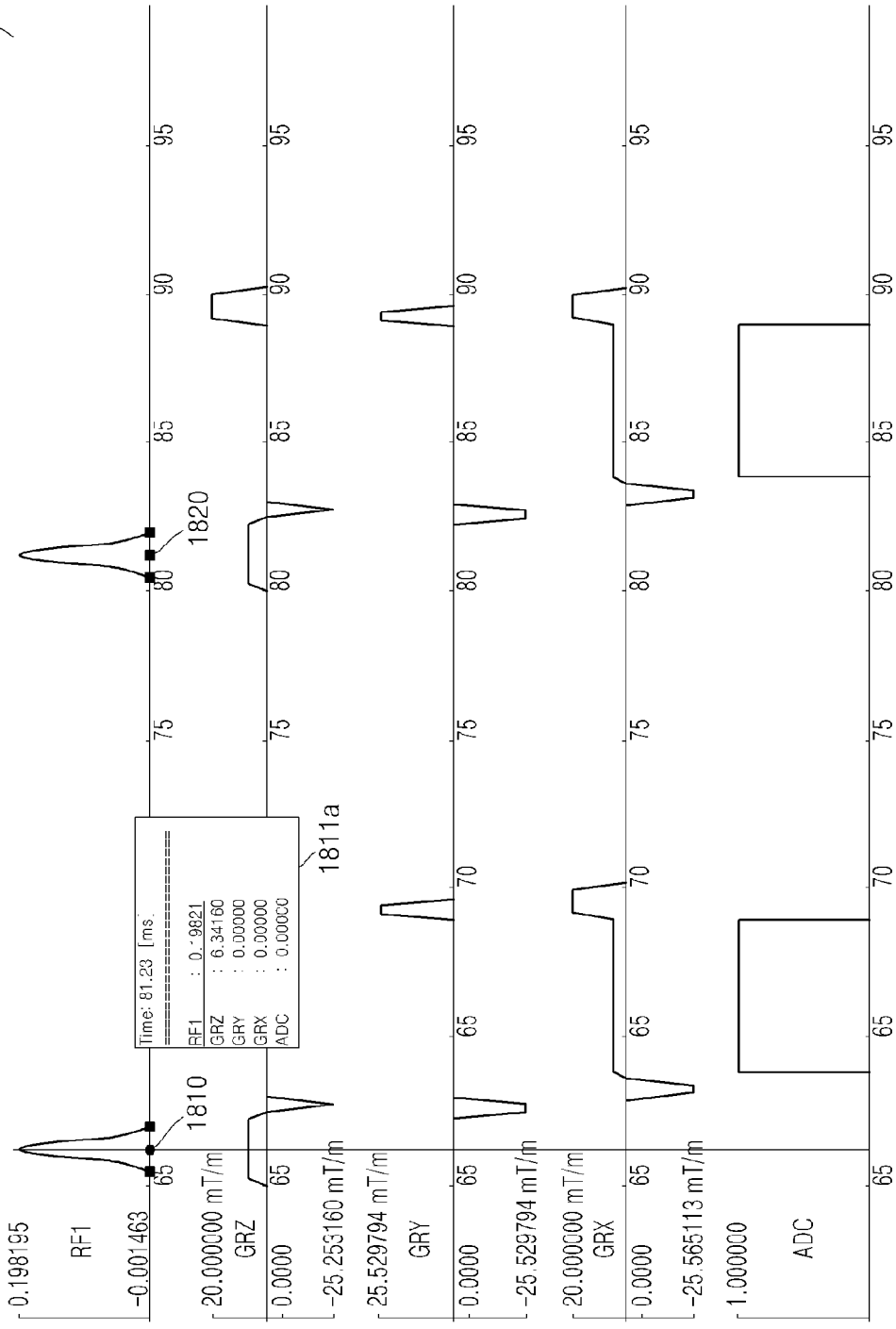
FIGS. 18A, 18B, and 18C are examples of screens on which time difference information between POIs of a pulse sequence for MRI is displayed, according to an exemplary embodiment.
Figure 18B:
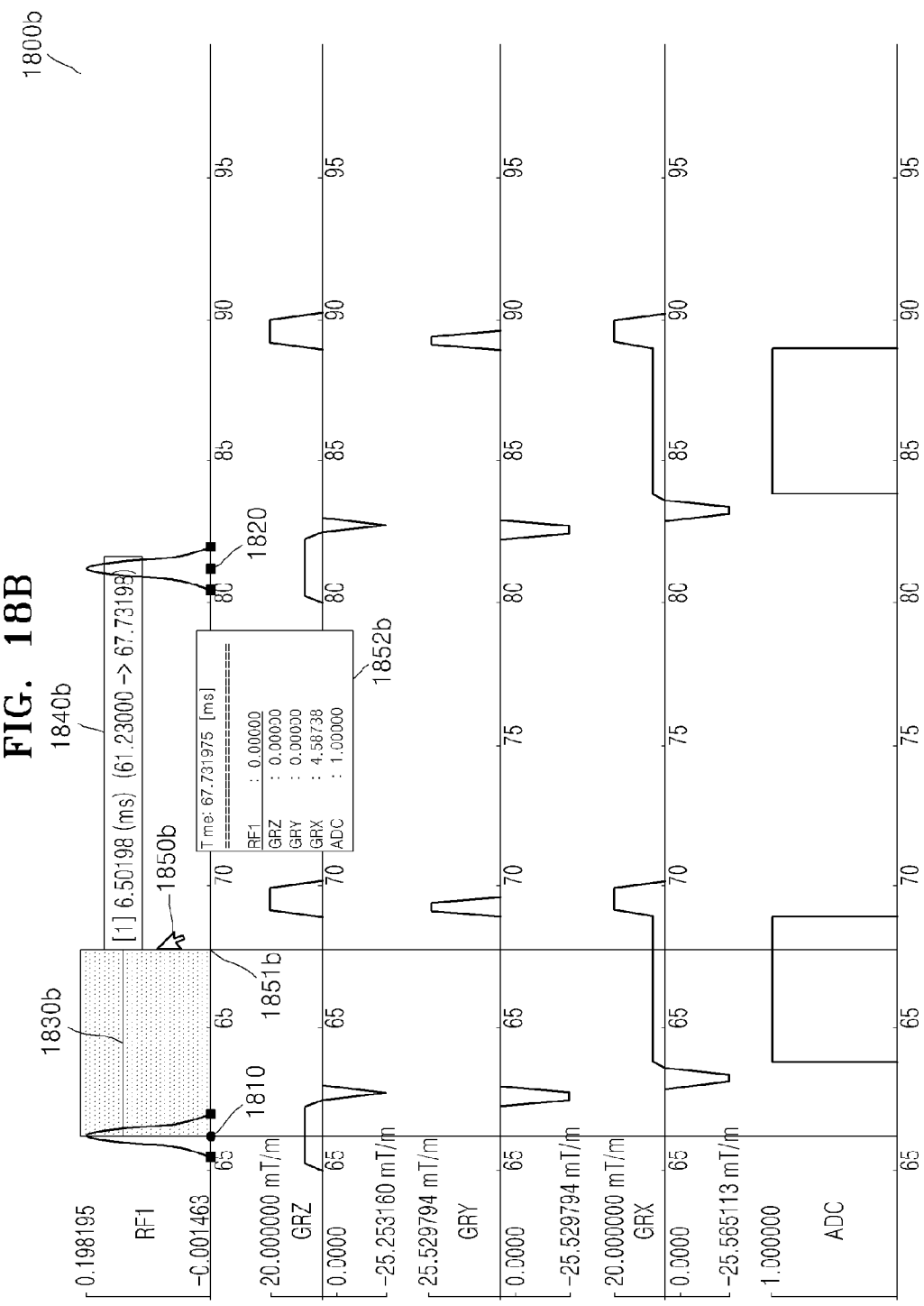
Figure 18C:
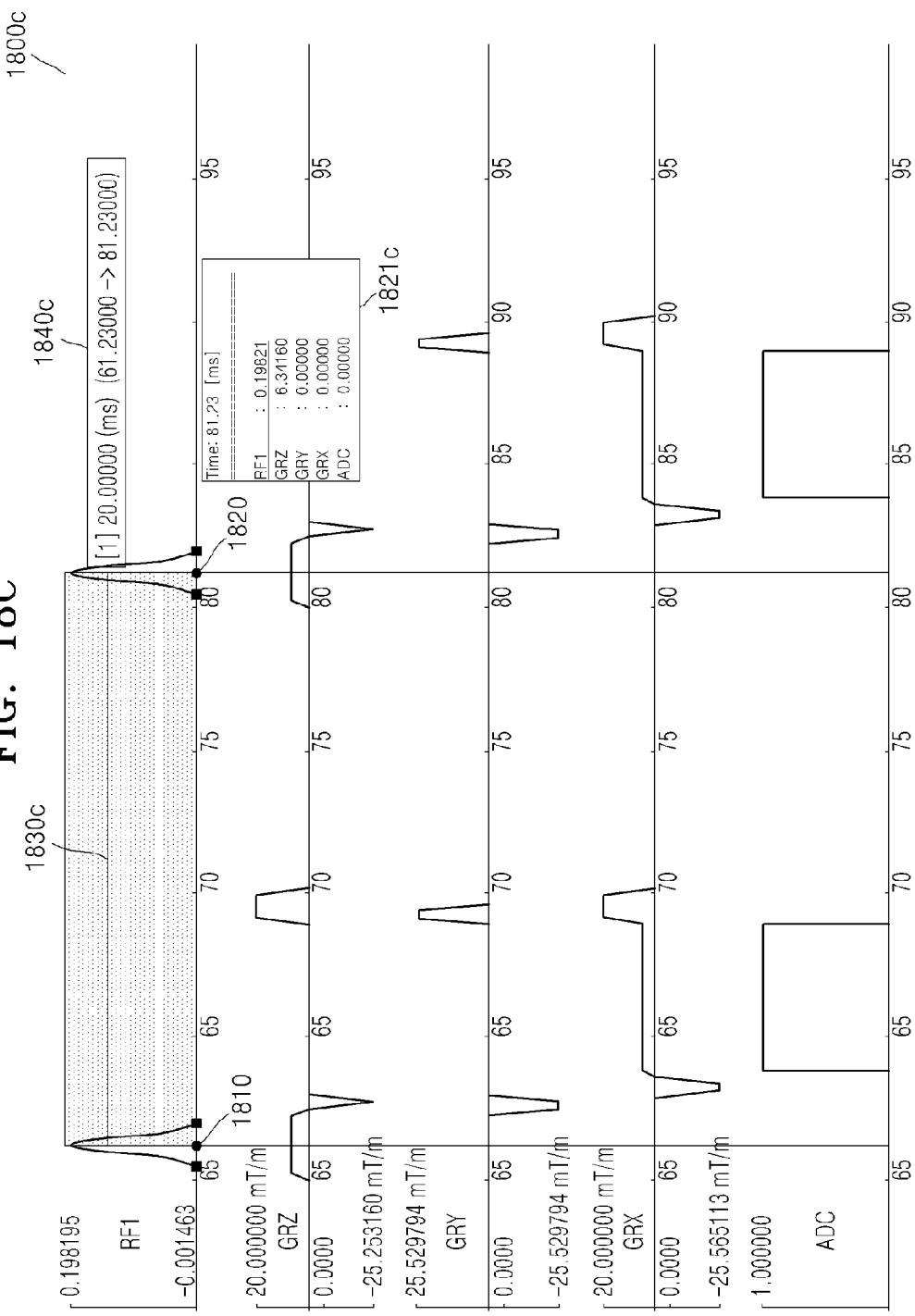

FIGS. 18A, 18B, and 18C illustrate examples of screens on which time difference information between POIs of a pulse sequence for MRI is displayed, according to an exemplary embodiment.

In detail, FIGS. 18A, 18B, and 18C show an operation in which the MRI apparatus 500 measures repetition time information of an RF pulse, with the elapsement of time.

Referring to FIG. 18A, a user interface screen 1800a in which a pointer of an input device matches a POI 1810 closest to a position of the pointer in operation 1750 is shown. Further, information 1811a about the matched POI 1810 may be displayed. In detail, the matched POI 1810 corresponds to a position of a central point of the matched POI 1810.

A user may measure a time difference between the matched POI 1810 and a central point 1820 of a next RF pulse, for measuring a repetition time (TR) of an RF pulse.

Referring to FIG. 18B, a user interface screen 1800b corresponding to an operation in which the user drags a pointer 1850b of the input device from the matched POI 1801 to the central point 1820 of the next RF pulse is shown.

The user moves the pointer 1850b to a certain point 1851b between RF pulses of a pulse sequence of the input device. Further, the certain point 1851b is not disposed within a predetermined range from at least one POI, and thus, the pointer 1850b of the input device does not match the POI.

When the user moves the pointer 1850b to the central point 1820 of the next RF pulse, the control unit 560 of the MRI apparatus 500 may display, in the display unit 520, information 1852b about the certain point 1851b in which the pointer 1850b is disposed. In addition, the control unit 560 may display time difference information 1840b as between the matched POI 1810 and the certain point 1851b in which the pointer 1850b is disposed.

In detail, the time difference information 1840b as between the matched POI 1810 and the certain point 1851b in which the pointer 1850b is disposed may include 61.23000 [ms] that is a time corresponding to the matched POI 1810, 67.73198 [ms] that is a time corresponding to the certain point 1851b in which the pointer 1850b is disposed, and 6.50198 [ms] that is a time difference as between the matched POI 1810 and the certain point 1851b in which the pointer 1850b is disposed.

When the user moves the pointer to a desired point, the user checks, in real time, the time difference information between the matched POI 1810 and the certain point 1851b in which the pointer 1850b is disposed.

Referring to FIG. 18C, a user interface screen 1800c in which information 1840b about a time difference 1830c between the matched POI 1810 and a selected POI 1820 is shown.

In detail, a pointer is dragged from the matched POI 1810, and is disposed within a predetermined range from at least one default POI or at least one additional POI displayed by the display unit 520. At this time, the snapping processing unit 540 selects another POI 1820, which is closest to a position of the pointer, from among the at least one default POI and the at least one additional POI displayed by the display unit 520.

In detail, in order to measure a repetition time of an RF pulse, the user drags the pointer 1850b of the input device from the POI 1820, which is a central point of a next RF pulse, to within a predetermined range. At this time, the snapping processing unit 540 selects the POI 1820 that is the central point of the next RF pulse which is closest to the pointer 1850b.

Moreover, the display unit 520 displays information 1840c about a time difference 1830c as between the matched POI 1810 and the selected POI 1820. In detail, the information 1840c about the time difference 1830c may include 61.23000 [ms] that is a time corresponding to a central point of an initial RF pulse that is the matched POI 1810, 81.23000 [ms] that is a time corresponding to the central point of the next RF pulse that is the selected POI 1820, and 20.0000 [ms] that is a time difference as between the matched POI and the selected POI.

In addition, the display unit 520 may further display information 1821c about the selected POI 1820.

The user accurately confirms that a repetition time (TR) of an RF pulse is 20.0000 [ms], by using the information 1840c (which is displayed by the display unit 520) about the time difference 1830c.

An operation in which the user clicks a pointer of the input device and drags the pointer from one POI to another POI in order to acquire the information 1840c about the time difference 1830c has been described above with reference to FIGS. 18A, 18B, and 18C. However, a method in which the MRI apparatus 500 displays the information 1840c about the time difference 1830c is not limited thereto.

For example, the snapping processing unit 540 may select the other POI 1820 based on a user input, and the display unit 520 may display the information 1840c about the time difference 1830c between a time corresponding to the matched POI 1810 and a time corresponding to the selected POI 1820.

In detail, the pointer of the input device matches the POI 1810 closest thereto, and then, when the user inputs 'shift+f' button via a keyboard, time difference information between the matched POI 1810 and a next POI which is subsequent to the matched POI 1810 may be displayed. Further, when the user inputs 'shift+r' button via the keyboard, time difference information between the matched POI 1810 and a POI previous to the matched POI 1810 may be displayed.

Moreover, the MRI apparatus 500 according to an exemplary embodiment may set an annotation of time difference information. Hereinafter, an operation in which the MRI apparatus 500 sets an annotation of time difference information will be described in detail with reference to FIGS. 19, 20A, and 20B.

Figure 19:
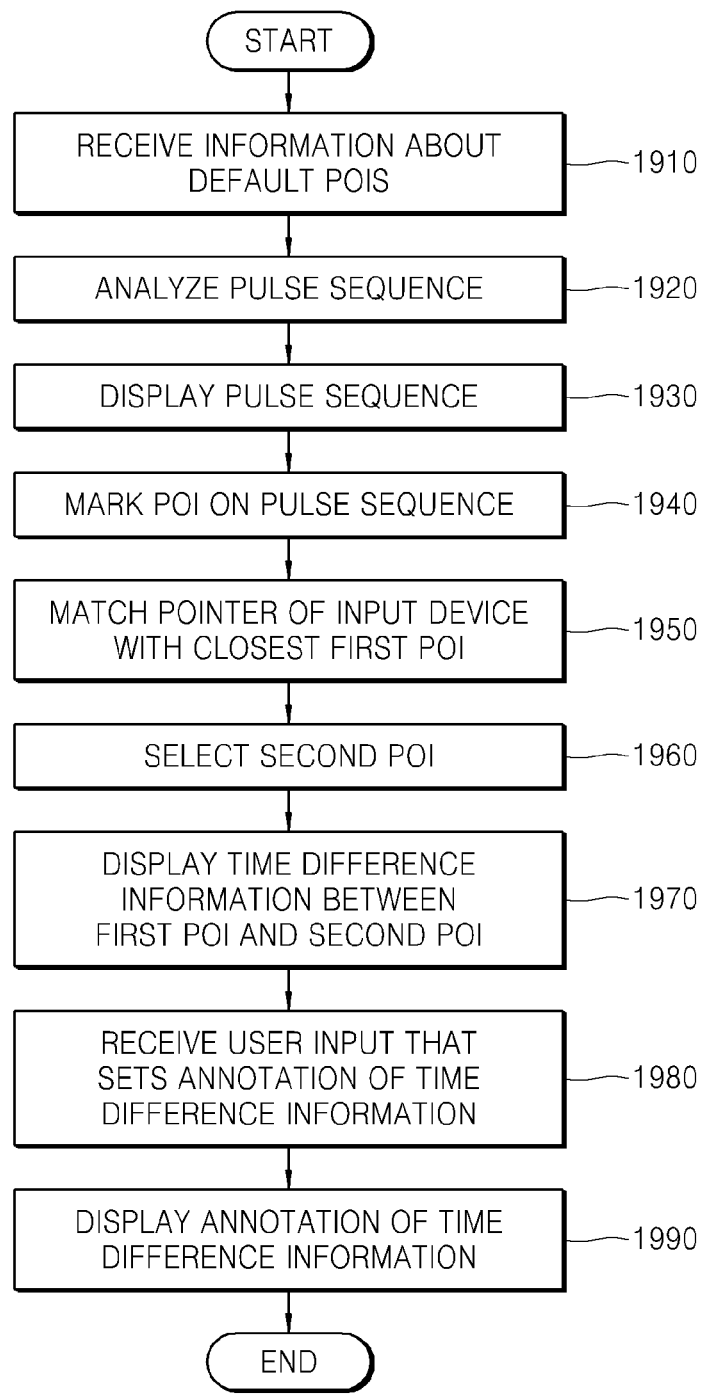
FIG. 19 is a flowchart of a method for providing information about a POI of a pulse sequence for MRI, according to another exemplary embodiment.

FIG. 19 is a flowchart of a method for providing information about a POI of a pulse sequence for MRI, according to another exemplary embodiment.

Operations 1910 to 1970 according to the exemplary embodiment of FIG. 19 may correspond to operations 1710 to 1770 according to the exemplary embodiment of FIG. 17. Thus, descriptions repetitive of operations 1710 to 1770 are not provided.

The MRI apparatus 500 according to an exemplary embodiment may set an annotation of time difference information which is similar to the annotation 1650b of the POI as illustrated in FIGS. 15 and 16.

In detail, the method for providing information about a POI of a pulse sequence for MRI according to another exemplary embodiment may receive an input which relates to setting an annotation of time difference information in operation 1980, and display the set annotation of the time difference information in operation 1990. Further, operation 1980 may be performed by the reception unit 510, and operation 1990 may be performed by the display unit 520.

The annotation of the POI used herein refers to text information in which a POI or a pulse is described, may be set by a user, and may be displayed on a user interface screen. Further, the annotation of the POI may include any one or more of various types of text information, such as a special sign, an equation, and/or a figure.

In detail, the user may enter, in an annotation of the time difference information, text information which includes a brief explanation of the time difference information and/or a name of the time difference information.

For example, in a case of measuring a time difference between a POI (which is a central point of an initial RF pulse) and a POI that is a central point of a next RF pulse, the user may enter 'TR' or 'time repetition' in an annotation of the time difference information.

Figure 20A:
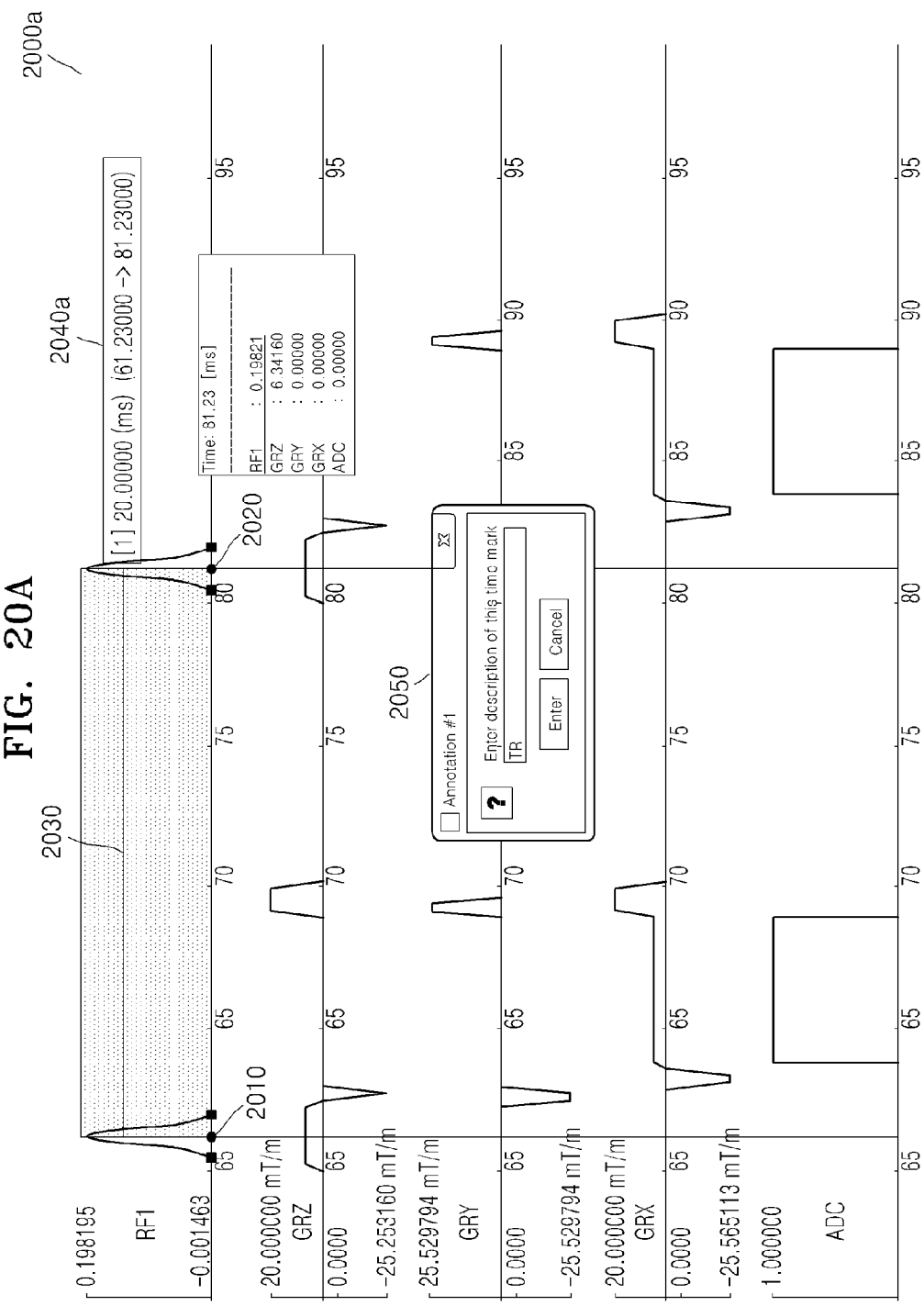

FIGS. 20A and 20B are examples of respective screens on which an annotation of time difference information between POIs of a pulse sequence for MRI is displayed, according to an exemplary embodiment.

FIG. 20A shows a user interface screen 2000a which includes a popup window 2050 for setting an annotation of time difference information.

In detail, a pointer matches a POI 2010 that is a central point of an initial RF pulse, and a POI 2020 that is a central point of a next RF pulse is selected for acquiring a repetition time (TR) of an RF pulse. The display unit 520 displays information 2040a about a time difference 2030 between the matched POI 2010 and the selected POI 2020. Subsequently, a popup window 2050 for setting an annotation of the information 2040a about a time difference 2030 may be displayed on a user interface screen 2000a.

The user may enter 'TR' in the annotation via the popup window 2050, for indicating that the measured time difference 2030 is the repetition time (TR) of the RF pulse.

Moreover, FIG. 20B shows a user interface screen 2000b on which an annotation of the time difference 2030 is displayed. In detail, the display unit 520 adds the annotation of the time difference 2030 into the information 2040b about the time difference 2030, and displays the information 2040b with the annotation added thereinto. However, the display unit 520 may display the annotation of the time difference 2030 separately from the information 2040b about the time difference 2030 based on the user's setting.

As described above, according to one or more of the above-described exemplary embodiments, information about a POI of a pulse sequence for MRI is provided.

Moreover, a pulse sequence may be edited by using information about a POI of a pulse sequence for MRI.

The exemplary embodiments may be written as computer programs and may be implemented in general-use digital computers that execute the programs using a transitory or non-transitory computer-readable recording medium.

Examples of the computer-readable recording medium include magnetic storage media (e.g., ROM, floppy disks, hard disks, etc.), optical recording media (e.g., CD-ROMs or DVDs), and/or any other suitable medium which is readable by a computer.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the present inventive concept as defined by the following claims.

What is claimed is:

1. A magnetic resonance imaging (MRI) apparatus comprising:
 a receiver including an input device configured to receive information about at least one default point of interest (POI) of at least one pulse sequence;
 an image processor configured to analyze the at least one pulse sequence; and
 a display device configured to display a screen including the at least one pulse sequence on which the at least one default POI is marked, based on a result of the analyzing, and
 wherein the image processor is further configured to:
 when a first point indicated by the input device is located within a predetermined range from at least one of the at least one default POI on the screen, match the first point with a closest default POI from among the at least one default POI based on at least one distance between the first point and the at least one default POI; and
 control the display device to display first information about a first POI to which the first point is matched.

2. The MRI apparatus of claim 1, wherein:
the receiver is further configured to receive information about at least one additional POI of the at least one pulse sequence,
the display device is further configured to mark the at least one additional POI on the displayed at least one pulse sequence, and
the image processor is further configured to match the first point with a closest POI from among the at least one default POI and the at least one additional POI when the first point is located within the predetermined range from at least one of the at least one default POI and the at least one additional POI.

3. The MRI apparatus of claim 2, wherein the image processor is further configured to match a second point subsequently indicated by the input device with a next POI which is a closest POI from among the at least one default POI and the at least one additional POI.

4. The MRI apparatus of claim 2, wherein the receiver is further configured to store the received information about the at least one default POI and to store the received information about the at least one additional POI.

5. The MRI apparatus of claim 2, wherein the image processor is further configured to control the display device to display the first information about the first POI by using at least one of a popup window and a tooltip box.

6. The MRI apparatus of claim 2, wherein the image processor is further configured to control the display device to display additional information associated with at least one of the at least one default POI and the at least one additional POI, based on the first information.

7. The MRI apparatus of claim 2, wherein the at least one default POI comprises at least one from among a piece of information about a start point, an end point, and a central point of at least one pulse sequence and a piece of information about a start point and an end point of a plateau section.

8. The MRI apparatus of claim 2, wherein the receiver is further configured to receive an input which relates to editing the at least one pulse sequence.

9. The MRI apparatus of claim 8, wherein the image processor is further configured to edit at least one from among the at least one default POI and the at least one additional POI, based on the received input.

10. The MRI apparatus of claim 8, wherein the image processor is further configured to edit at least one from among the information about the first POI and additional information associated with the at least one default POI and the at least one additional POI, based on the received input.

11. The MRI apparatus of claim 2, wherein the image processor is further configured to be activated or deactivated based on an input received via the receiver.

12. The MRI apparatus of claim 2, wherein the at least one pulse sequence comprises a radio frequency (RF) pulse sequence, a gradient pulse sequence, and an analog-to-digital conversion (ADC) pulse sequence.

13. The MRI apparatus of claim 2, wherein:
the receiver is further configured to receive an input which relates to setting an annotation of the first POI, and
the display device is further configured to display the annotation of the first POI.

14. A magnetic resonance imaging (MRI) apparatus comprising:
a receiver including an input device configured to receive information about a first set of points of interest (POI) which includes at least one from among at least one default POI and at least one additional POI, for at least one pulse sequence;
an image processor configured to analyze the at least one pulse sequence; and
a display device configured to display a user interface screen which includes the at least one pulse sequence on which the first set of POI is marked, based on a result of the analyzing,
wherein the image is further configured to:
when a first point indicated by an input device is disposed within a predetermined range from at least one POI included in the first set of POI, match the first point with a first POI which is a closest POI from among the first set of POI to the first point based on at least one distance between the first point and the at least one default POI included in the first set of POI;
select a second POI which is different from the first POI from among the first set of POI;
generate time difference information which relates to a difference between a time corresponding to the first POI and a time corresponding to the second POI; and
control the display device to display the time difference information on the user interface screen.

15. The MRI apparatus of claim 14, wherein when a point indicated by the input device is dragged from the first POI and is disposed within the predetermined range from at least one POI included in the first set of POI, the image processor is further configured to select the second POI which is closest to a point corresponding to the dragged point from among the first set of POI, in the user interface screen.

16. The MRI apparatus of claim 14, wherein:
the receiver is further configured to receive an input which relates to setting an annotation of the time difference information, and
the display device is further configured to display the set annotation of the time difference information.

17. A method for providing information about a point of interest (POI) of at least one pulse sequence for magnetic resonance imaging (MRI), the method comprising:
receiving information about at least one default POI of the at least one pulse sequence;
analyzing the at least one pulse sequence;
displaying a screen including the at least one pulse sequence on which the at least one default POI is marked, based on a result of the analyzing;
matching a first point with a closest default POI from among the at least one default POI when the first point indicated by an input device is located within a predetermined range from at least one of the at least one default POI; and
displaying first information about a first POI to which the first point is matched.

18. The method of claim 17, wherein:
the receiving comprises receiving information about at least one additional POI of the at least one pulse sequence,
the screen includes the at least one pulse sequence on which the at least one default POI and the at least one additional POI are marked, and
the matching comprises matching the first point with a closest POI from among the at least one default POI and the at least one additional POI when the first point is located within the predetermined range from at least one of the at least one default POI and the at least one additional POI.

19. The method of claim 18, further comprising matching a second point subsequently indicated by the input device with a next POI which is a closest POI from among the at least one default POI and the at least one additional POI.

20. A method for providing information about a point of interest (POI) of a pulse sequence, the method comprising:
- receiving information about a first set of POI which includes at least from among at least one default POI and at least one additional POI, for at least one pulse sequence;
- analyzing the at least one pulse sequence;
- displaying a user interface screen which includes the at least one pulse sequence on which the first set of POI is marked, based on a result of the analyzing;
- when a first point indicated by an input device is disposed within a predetermined range from at least one POI included in the first set of POI, matching the first point with a first POI which is a closest POI from among the first set of POI to the first point based on at least one distance between the first point and the at least one POI included in the first set of POI;
- selecting a second POI which is different from the first POI from among the first set of POI; and
- generating time difference information which relates to a difference between a time corresponding to the first POI and a time corresponding to the second POI, and displaying the generated time difference information on the user interface screen.

* * * * *